United States Patent
Oh et al.

(10) Patent No.: US 9,455,268 B2
(45) Date of Patent: Sep. 27, 2016

(54) STAIRCASE-SHAPED CONNECTION STRUCTURES OF THREE-DIMENSIONAL SEMICONDUCTOR DEVICES

(71) Applicants: Jung-Ik Oh, Seongnam-si (KR); Daehyun Jang, Suwon-si (KR); Ha-Na Kim, Seoul (KR); Kyoungsub Shin, Seongnam-si (KR)

(72) Inventors: Jung-Ik Oh, Seongnam-si (KR); Daehyun Jang, Suwon-si (KR); Ha-Na Kim, Seoul (KR); Kyoungsub Shin, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/520,751

(22) Filed: Oct. 22, 2014

(65) Prior Publication Data

US 2015/0228623 A1 Aug. 13, 2015

(30) Foreign Application Priority Data

Feb. 13, 2014 (KR) .......................... 10-2014-0016653

(51) Int. Cl.
| | | |
|---|---|---|
| *H01L 25/00* | (2006.01) | |
| *H01L 27/11* | (2006.01) | |
| *H01L 45/00* | (2006.01) | |
| *H01L 27/115* | (2006.01) | |
| *H01L 25/065* | (2006.01) | |

(52) U.S. Cl.
CPC ... *H01L 27/11582* (2013.01); *H01L 27/11575* (2013.01); *H01L 25/0657* (2013.01); *H01L 25/50* (2013.01); *H01L 27/11521* (2013.01); *H01L 45/122* (2013.01); *H01L 45/1253* (2013.01)

(58) Field of Classification Search
CPC .............. H01L 25/0657; H01L 25/50; H01L 27/11521; H01L 45/1253; H01L 45/122
See application file for complete search history.

(56) References Cited

U.S. PATENT DOCUMENTS

| | | | | |
|---|---|---|---|---|
| 6,411,494 | B1 * | 6/2002 | Watt ........................... | 361/306.3 |
| 7,741,715 | B2 * | 6/2010 | Kim ..................... | H01L 23/562 |
| | | | | 257/618 |
| 7,910,432 | B2 | 3/2011 | Tanaka et al. | |
| 8,313,998 | B2 | 11/2012 | Satonaka et al. | |
| 8,338,956 | B2 | 12/2012 | Maeda | |
| 8,383,512 | B2 | 2/2013 | Chen et al. | |
| 8,497,533 | B2 * | 7/2013 | Hyun ................ | H01L 27/11551 |
| | | | | 257/260 |
| 8,569,182 | B2 * | 10/2013 | Park .................. | H01L 27/11548 |
| | | | | 257/E21.219 |
| 8,759,217 | B1 * | 6/2014 | Chen ................. | H01L 21/76838 |
| | | | | 438/689 |
| 8,970,040 | B1 * | 3/2015 | Chen ............................ | 257/758 |
| 9,230,904 | B2 * | 1/2016 | Eun ..................... | H01L 27/2481 |
| 2008/0303131 | A1 * | 12/2008 | McElrea et al. ............. | 257/686 |
| 2009/0284728 | A1 * | 11/2009 | Van Empel ..................... | 355/71 |

(Continued)

OTHER PUBLICATIONS

Wikipedia, the free encyclopedia, "Stairs", downloaded Aug. 12, 2014 from http://en.wikipedia.org/w/index.php?title=Stairs&printable=yes, 11 pp.

*Primary Examiner* — Ida M Soward
(74) *Attorney, Agent, or Firm* — Myers Bigel & Sibley, P.A.

(57) ABSTRACT

Provided is a staircase-shaped connection structure of a three-dimensional semiconductor device. The device includes an electrode structure on a substrate, the electrode structure including an upper staircase region, a lower staircase region, and a buffer region therebetween. The electrode structure includes horizontal electrodes sequentially stacked on the substrate, the horizontal electrodes include a plurality of pad regions constituting a staircase structure of each of the upper and lower staircase regions, and the buffer region has a width that is larger than that of each of the pad regions.

20 Claims, 28 Drawing Sheets

(56) References Cited

U.S. PATENT DOCUMENTS

| | | | |
|---|---|---|---|
| 2010/0013049 A1 | 1/2010 | Tanaka et al. | |
| 2010/0052042 A1* | 3/2010 | Tanaka et al. | 257/324 |
| 2010/0090188 A1* | 4/2010 | Futatsuyama | 257/2 |
| 2010/0109071 A1* | 5/2010 | Tanaka | H01L 27/11582 257/324 |
| 2010/0193930 A1* | 8/2010 | Lee | 257/686 |
| 2010/0323505 A1 | 12/2010 | Ishikawa et al. | |
| 2011/0092038 A1* | 4/2011 | Choi | H01L 27/11526 438/268 |
| 2011/0121403 A1* | 5/2011 | Lee | H01L 27/11526 257/390 |
| 2011/0169071 A1 | 7/2011 | Uenaka et al. | |
| 2012/0108048 A1* | 5/2012 | Lim | H01L 27/11529 438/586 |
| 2012/0187471 A1* | 7/2012 | Yu | H01L 27/11582 257/324 |
| 2012/0280299 A1* | 11/2012 | Yun | H01L 27/1157 257/314 |
| 2012/0319173 A1 | 12/2012 | Ko et al. | |
| 2013/0009274 A1 | 1/2013 | Lee et al. | |
| 2013/0020647 A1* | 1/2013 | Hwang | H01L 27/11565 257/365 |
| 2013/0043509 A1 | 2/2013 | Cho et al. | |
| 2014/0162420 A1* | 6/2014 | Oh et al. | 438/270 |
| 2014/0203442 A1* | 7/2014 | Yun | G11C 5/063 257/773 |
| 2014/0329379 A1* | 11/2014 | Kim et al. | 438/586 |

* cited by examiner

STAIRCASE-SHAPED CONNECTION STRUCTURES OF THREE-DIMENSIONAL SEMICONDUCTOR DEVICES

CROSS-REFERENCE TO RELATED APPLICATION

This U.S. non-provisional patent application claims priority under 35 U.S.C. §119 to Korean Patent Application No. 10-2014-0016653, filed on Feb. 13, 2014, in the Korean Intellectual Property Office, the entire contents of which are hereby incorporated by reference.

BACKGROUND OF THE INVENTION

Example embodiments of the inventive concepts relate to three-dimensional semiconductor devices, and in particular, to connection structures of three-dimensional semiconductor devices and a methods of forming the same.

In semiconductor devices, increased integration is an important factor in realizing high-performance low-cost devices. Currently, in a two-dimensional memory semiconductor device or a planar memory semiconductor device, integration is largely affected by a technique of forming a fine pattern, because integration is often determined by an area that a unit memory cell occupies. However, since it may be difficult and/or expensive to form a fine pattern, it may be difficult to continue to increase integration of a two-dimensional memory semiconductor device.

To overcome such a limitation, three-dimensional memory devices (that is, including three-dimensionally arranged memory cells) have been proposed. Not only the memory cells but also interconnection lines (e.g., word lines or bit lines) are three-dimensionally arranged in the three-dimensional memory devices.

SUMMARY

Example embodiments of the inventive concepts can provide a highly reliable fabrication process capable of forming a staircase-shaped connection structure.

Example embodiments of the inventive concepts can provide a simplified fabrication process capable of forming a staircase-shaped connection structure.

Example embodiments of the inventive concepts can provide a semiconductor device including electrodes with a staircase-shaped connection structure.

According to example embodiments of the inventive concepts, a three-dimensional semiconductor device may include an electrode structure on a substrate, the electrode structure including an upper staircase region, a lower staircase region, and a buffer region therebetween. The electrode structure may include horizontal electrodes sequentially stacked on the substrate, the horizontal electrodes may include a plurality of pad regions constituting a staircase structure of each of the upper and lower staircase regions, and the buffer region may have a width that is larger than that of each of the pad regions.

In example embodiments, the buffer region may have a thickness that is smaller than or equal to a minimum thickness of the upper staircase region and is greater than or equal to a maximum thickness of the lower staircase region.

In example embodiments, the device may further include an insulating layer on, and in some embodiments covering, the electrode structure. The insulating layer may have a flat top surface and covers an entire top surface of the buffer region.

In example embodiments, the insulating layer may have a substantially monotonically increasing thickness in a direction from the upper staircase region to the lower staircase region.

In example embodiments, the buffer region may be in direct contact with the insulating layer.

In example embodiments, the electrode structure further may include a cell array region, the upper staircase region may be located between the cell array region and the lower staircase region, and the upper and lower staircase regions may have a stepwise-decreasing thickness in a direction away from the cell array region.

In example embodiments, each of the upper and lower staircase regions may have at least two different thicknesses, which are changed in an alternating manner, when measured at a same distance from the cell array region.

In example embodiments, when viewed in a plan view, an uppermost one of the horizontal electrodes constituting the buffer region may include a connecting portion continuously extending from the upper staircase region to the lower staircase region, and a protruding portion horizontally protruding from the connecting portion, the protruding portion being spaced apart from at least one of the upper and lower staircase regions.

In example embodiments, when viewed in a plan view, an uppermost one of the horizontal electrodes constituting the buffer region may extend from the upper staircase region continuously to the lower staircase region and may expose a second uppermost one of the horizontal electrodes from the upper staircase region continuously to the lower staircase region.

In example embodiments, the device may further include charge-storing-type and/or variable-resistance-type memory cells that may be three-dimensionally arranged on the substrate.

According to other example embodiments of the inventive concepts, a semiconductor device may comprise a staircase on the substrate. The staircase comprises a plurality of steps having conductive treads and an intermediate landing. In some embodiments, the intermediate landing is deeper than each of the conductive treads. Moreover, in some of the embodiments, the intermediate landing includes a conductive surface. Also, in some embodiments, at least one of the conductive treads includes multiple levels.

Other example embodiments may further comprise a plurality of conductive vias, a respective one of which electrically contacts a respective one of the respective treads and extends away from the respective one of the conductive treads. Other embodiments may further comprise an insulating layer on the staircase. The insulating layer includes a flat outer surface on the steps, and a flat outer surface on the intermediate landing. In still other embodiments, the insulating layer increases in thickness going down the steps of the staircase.

According to example embodiments of the inventive concepts, a method of fabricating a three-dimensional semiconductor device may include sequentially stacking a plurality of horizontal layers on a substrate to form a stack, patterning some of the horizontal layers to form a first staircase region with at least one first multi-level stair, patterning others of the horizontal layers to form a second staircase region with at least one second multi-level stair, and patterning both of the first and second staircase regions at once to form single-level stairs in each of the first and second multi-level stairs. The first and second staircase regions may be formed in such a way that a distance therebetween is larger than a width of each of the single-level stairs therein.

In example embodiments, the first and second multi-level stairs may be formed by at least one trimming process, and the trimming process may include forming a mask pattern on, and in some embodiments to cover, the horizontal layers, etching the horizontal layers to a multi-layer depth using the mask pattern as an etch mask, etching the mask pattern to reduce an occupying area of the mask pattern, and etching the horizontal layers to a multi-layer depth using the etched mask pattern as an etch mask.

In example embodiments, the forming of the single-level stairs may include forming a photoresist layer on, and in some embodiments to cover, the first and second staircase regions, performing a photolithography process to form a photoresist pattern, in which at least one opening is formed across the first and second multi-level stairs, etching the stack to a single-layer depth using the photoresist pattern as an etch mask, and removing the photoresist pattern.

In example embodiments, the photolithography process may include exposing the first and second staircase regions at once, and the opening may be formed to continuously cross both of the first and second staircase regions.

In example embodiments, the photolithography process may include first and second exposure steps, which are performed to expose the first and second staircase regions, respectively.

In example embodiments, the first and second exposure steps may be performed using different process conditions of focal length.

In example embodiments, the at least one opening includes a first opening crossing the first staircase region, and a second opening crossing the second staircase region. The first and second openings may be formed spaced apart from each other between the first and second staircase regions.

In example embodiments, the stack may further include a cell array region, the first staircase region may be formed between the cell array region and the second staircase region, and each of the first and second staircase regions may have a stepwise-decreasing thickness in a direction away from the cell array region.

In example embodiments, the method may further include forming vertical patterns penetrating the stack, and forming a memory layer between the vertical patterns and the horizontal layers. The memory layer may include a layer capable of realizing a charge-storing-type and/or variable-resistance-type memory element.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
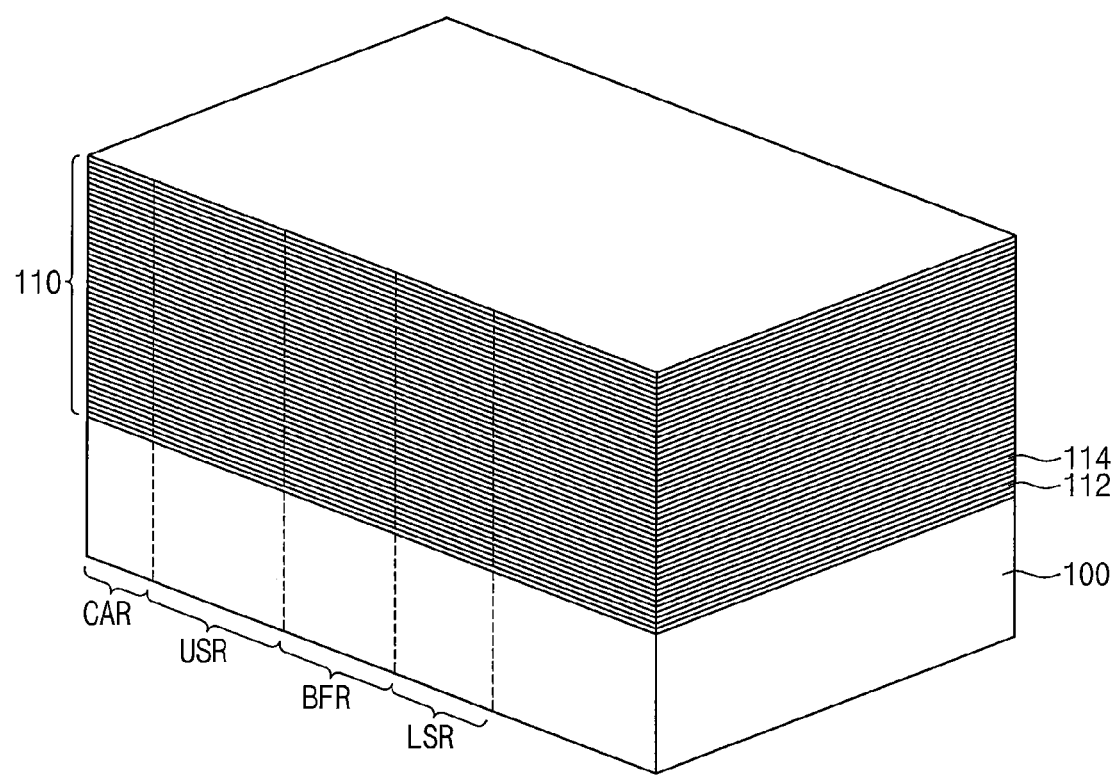
FIGS. 1-5, 6A, 6B, 7-11, 12A and 12B are perspective views illustrating a method of forming a staircase-shaped connection structure according to example embodiments of the inventive concepts.

It should be noted that these figures are intended to illustrate the general characteristics of methods, structures and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1-5, 6A, 6B, 7-11, 12A and 12B are perspective views illustrating a method of forming a staircase-shaped connection structure according to example embodiments of the inventive concepts.

Referring to FIG. 1, a stack 110 may be formed on a substrate 100. In example embodiments, the substrate 100 may include a layer having a semiconductor property. For example, the substrate 100 may be a semiconductor wafer or a multi-layered structure including at least one semiconductor layer, but example embodiments of the inventive concepts are not limited thereto.

The stack 110 and/or the substrate 100 may include a cell array region CAR, an upper staircase region USR, a buffer region BFR, and a lower staircase region LSR. The upper staircase region USR may be located between the cell array region CAR and the lower staircase regions LSR, and the buffer region BFR may be located between the upper and lower staircase regions USR and LSR.

The stack 110 may include a plurality of interlayered insulating layers 112 and a plurality of horizontal layers 114 alternatingly stacked on the substrate 100. The horizontal layers 114 may be formed of a material having an etch selectivity with respect to the interlayered insulating layers 112. For example, each of the interlayered insulating layers 112 may be a silicon oxide layer, and each of the horizontal layers 114 may include at least one of a silicon nitride layer, a silicon oxynitride layer, a poly silicon layer, or metal layers.

In order to reduce complexity in the drawings, the stack 110 including twenty four horizontal layers 114 is illustrated in FIGS. 1 through 12B, but example embodiments of the inventive concepts are not limited thereto and the number of the horizontal layers 114 constituting the stack 110 may range from 32 to 128. For example, the number of the horizontal layers 114 constituting the stack 110 may range from 4 to 1024.

Figure 2:
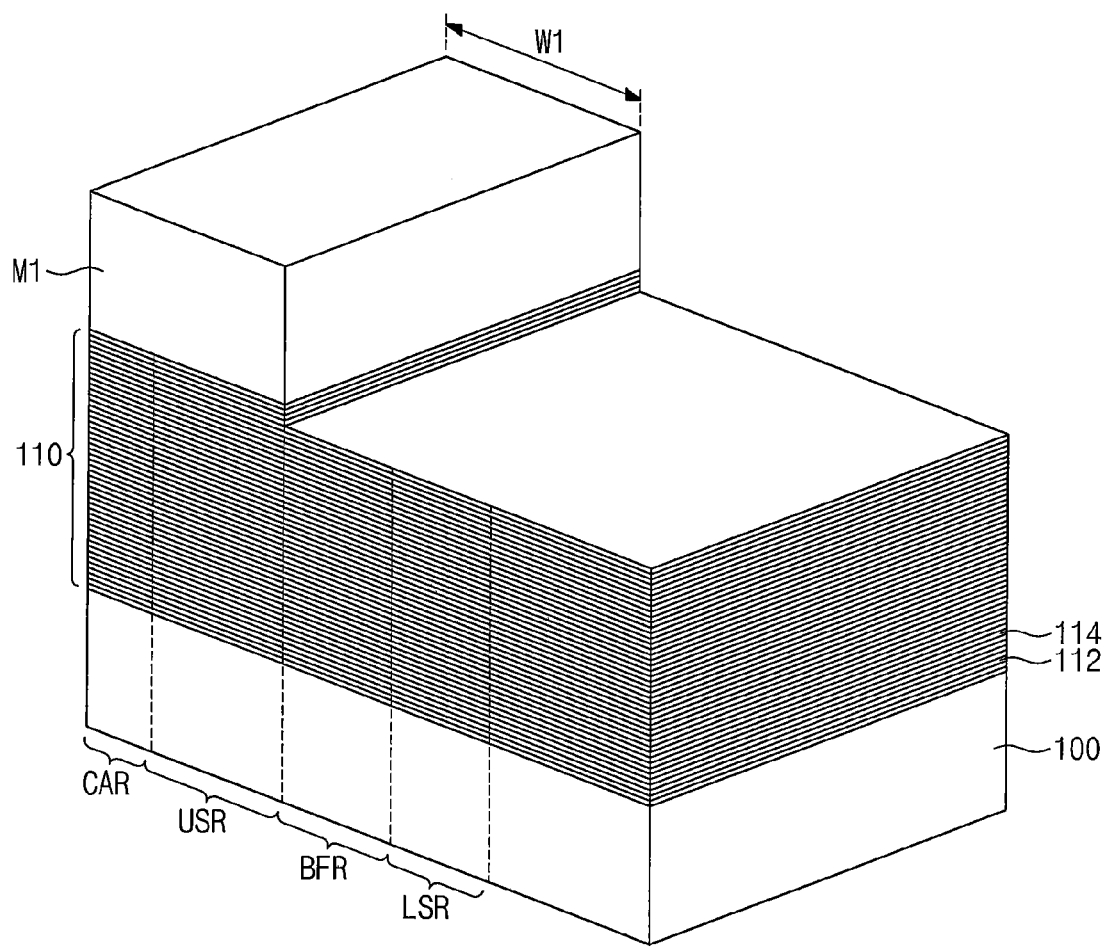
Figure 3:
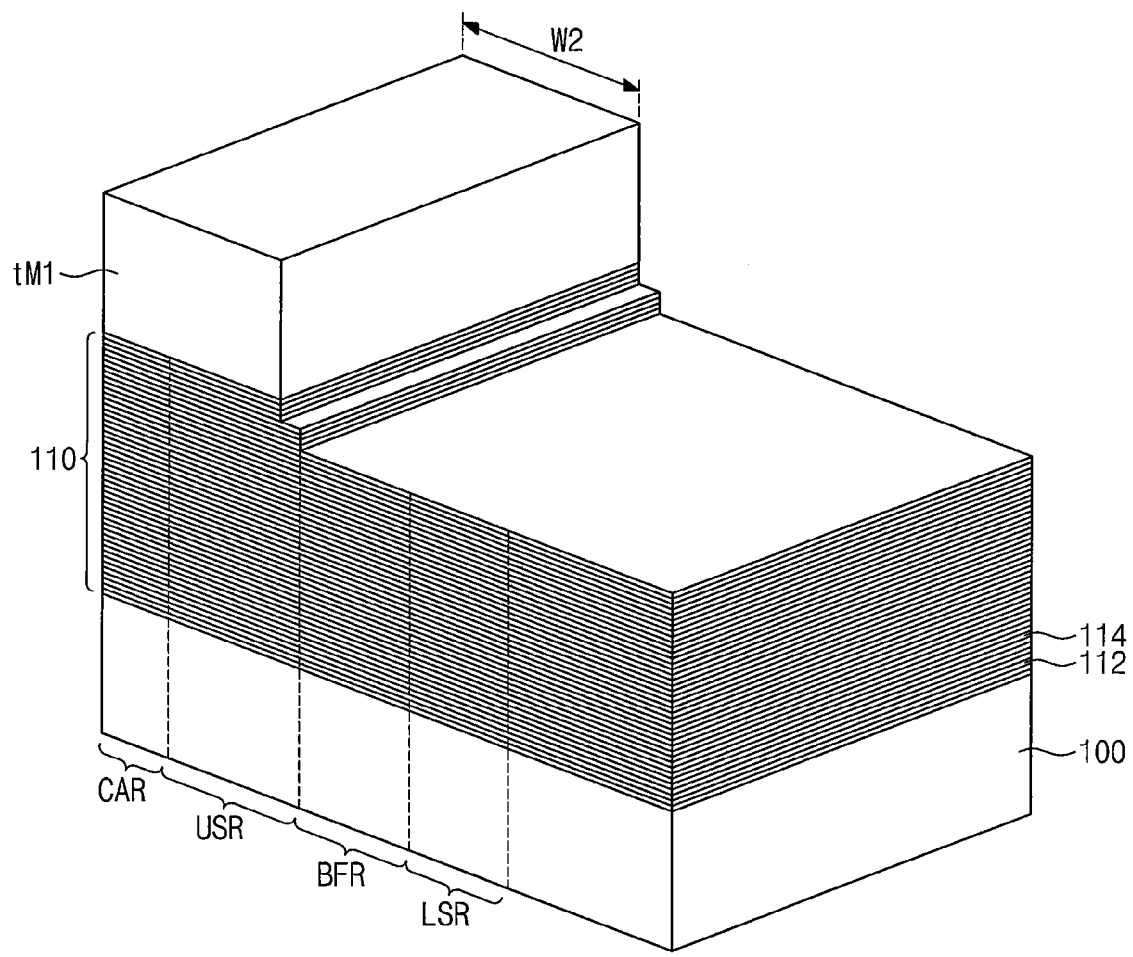

The stack 110 may be patterned to form an upper staircase structure USS including multi-level stairs, which is provided in the upper staircase region USR of the stack 110. In example embodiments, the upper staircase structure USS may be formed by a trimming process. For example, as shown in FIGS. 2 and 3, the trimming process may include forming a first mask pattern M1 on the stack 110, performing a first etching step using the first mask pattern M1 as an etch mask, etching the first mask pattern M1 to form a trimmed first mask pattern tM1, and performing a second etching step re-using the trimmed first mask pattern tM1 as an etch mask. The first mask pattern M1 may be or include a photoresist layer.

In example embodiments, the first and second etching steps may be performed to etch several layers of the horizontal layers 114. For example, an etch depth in each of the first and second etching steps may be greater than two times a vertical pitch of each of the horizontal layers 114. Accordingly, the stairs constituting the upper staircase structure USS may be formed to have a height difference that is greater than two times the vertical pitch of each of the horizontal layers 114. This etching method may be referred to as a "multi-layer etching method" below.

If the first mask pattern M1 has a first width W1 at an initial stage, as the result of the etching of the first mask pattern M1, the trimmed first mask pattern tM1 may have a second width W2 that is smaller than the first width W1. In other words, the trimmed first mask pattern tM1 may have a smaller occupied area than the first mask pattern M1. For example, the first mask pattern M1 may be formed to cover the cell array region CAR and the upper staircase region USR and expose the buffer region BFR and the lower staircase region LSR, and the trimmed first mask pattern tM1 may be formed to cover the cell array region CAR and a portion of the upper staircase region USR and expose the remaining portion of the upper staircase region USR, the buffer region BFR, and the lower staircase region LSR.

Accordingly, the trimmed first mask pattern tM1 may be formed to expose one of the horizontal layers 114, which is newly exposed by the first etching step, as well as another one of the horizontal layers 114, which has been covered with the first mask pattern M1 during the first etching step. This means that, during the first and second etching steps, an etching step is twice performed on a portion exposed by the first mask pattern M1 and is once performed on another portion newly exposed by the trimmed first mask pattern tM1. As a result, as shown in FIG. 3, two stairs may be formed in the upper staircase region USR of the stack 110.

In order to reduce complexity in the drawings and to provide better understanding of example embodiments of the inventive concepts, an example of example embodiments, in which the trimming process includes two etching steps, is illustrated in FIGS. 2 and 3. However, in certain embodiments, during the trimming process, the first mask pattern M1 may be etched three times or more and then re-used in three or more etching steps.

Figure 4:
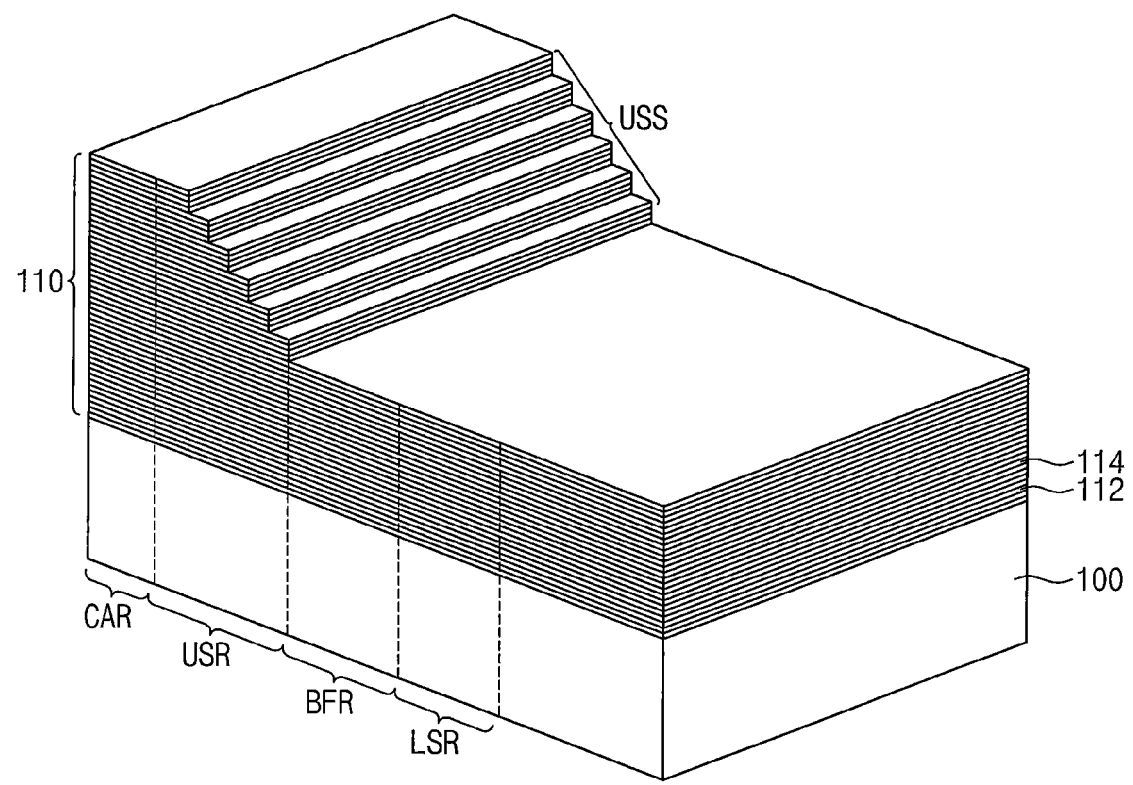

Thereafter, as shown in FIG. 4, the trimming process may be repeatedly performed at least once to form the upper staircase structure USS in the upper staircase region USR of the stack 110.

Figure 5:
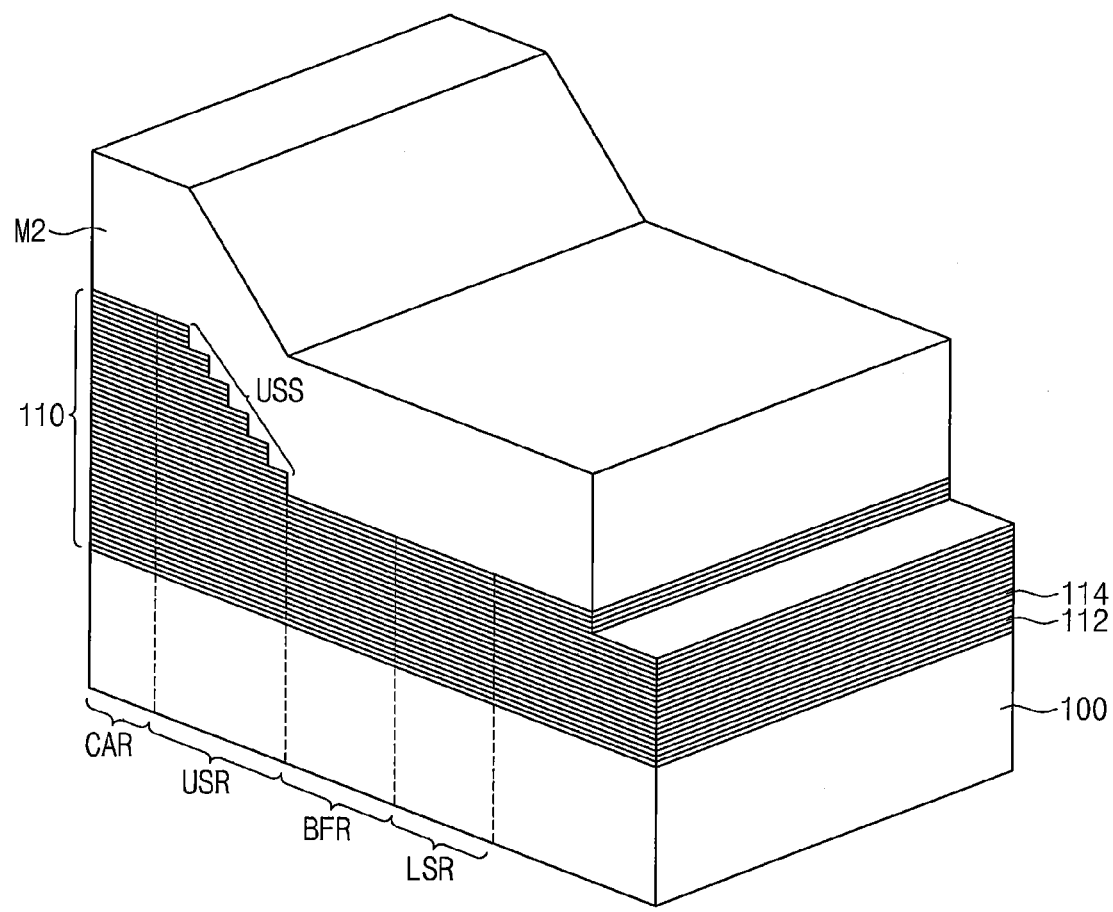
Figure 6A:
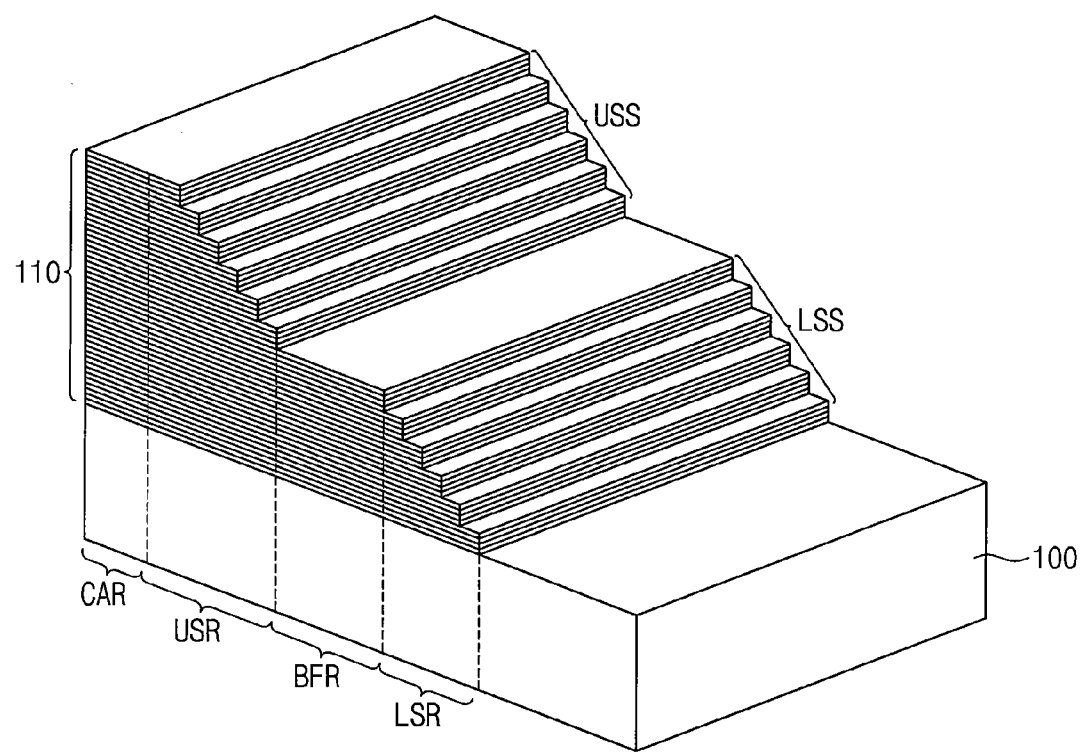

Referring to FIGS. 5 and 6A, a lower staircase structure LSS may be formed in the lower staircase region LSR of the stack 110. Similar to the upper staircase structure USS, the lower staircase structure LSS may be formed by performing the trimming process on the lower staircase region LSR of the stack 110 at least once. For example, the formation of the lower staircase structure LSS may include forming a second mask pattern M2 to cover the cell array region CAR, the upper staircase region USR, the buffer region BFR, and the lower staircase region LSR, and re-using the second mask pattern M2 as an etch mask. Here, the second mask pattern M2 may be or include a photoresist layer.

The lower staircase structure LSS may be formed apart from the upper staircase structure USS with the buffer region BFR interposed therebetween. For example, a distance between the lower and upper staircase structures LSS and USS or a width of the buffer region BFR may be greater than a width of each of the multi-level stairs, which are formed in each of the lower and upper staircase structures LSS and USS. In example embodiments, the width of the buffer region BFR may be 3 to 150 times the width of each of the multi-level stairs. The upper and lower staircase structures USS and LSS may be formed to have a stepwise-decreasing thickness in a direction away from the cell array region CAR, as shown in FIG. 6A.

Figure 6B:
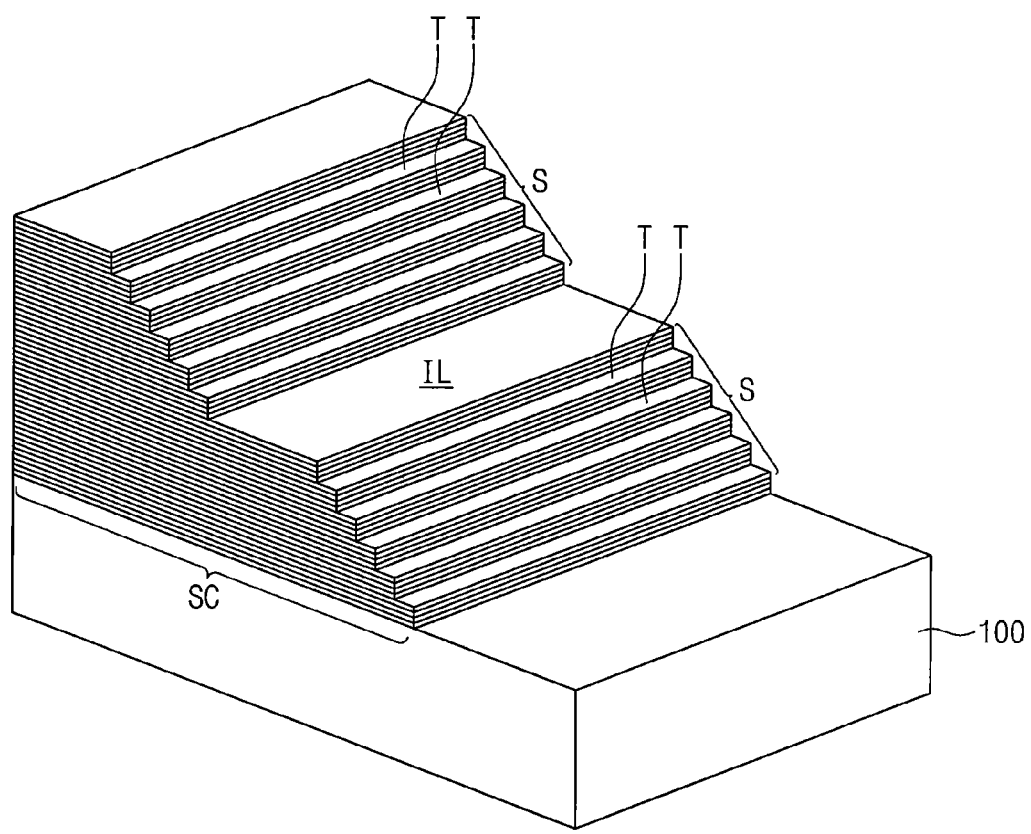

FIG. 6B corresponds to FIG. 6A, but uses conventional terminology for a staircase. As is well known, a stairway or staircase is a construction designed to bridge a large vertical distance by dividing it into smaller vertical distance called steps. A step includes a tread and a riser. The tread is the part of the stairway that is stepped on. The tread depth is measured from the outer edge of the step to the vertical riser between steps. The width is measured from one side to the other. A riser is the vertical portion between each tread on the stair. A landing or platform is an area of a floor near the top or bottom step of a stair. An intermediate landing is a platform that is built as part of the stair. Thus, as illustrated in FIG. 6B, a semiconductor device according to various embodiments of the inventive concepts includes a staircase SC on a substrate 100. The staircase SC comprises a plurality of steps S having conductive treads T. The staircase SC also comprises an intermediate landing IL. As illustrated in FIG. 6B, the intermediate landing IL is deeper than each of the conductive treads T. The intermediate landing IL may include a conductive surface.

Figure 7:
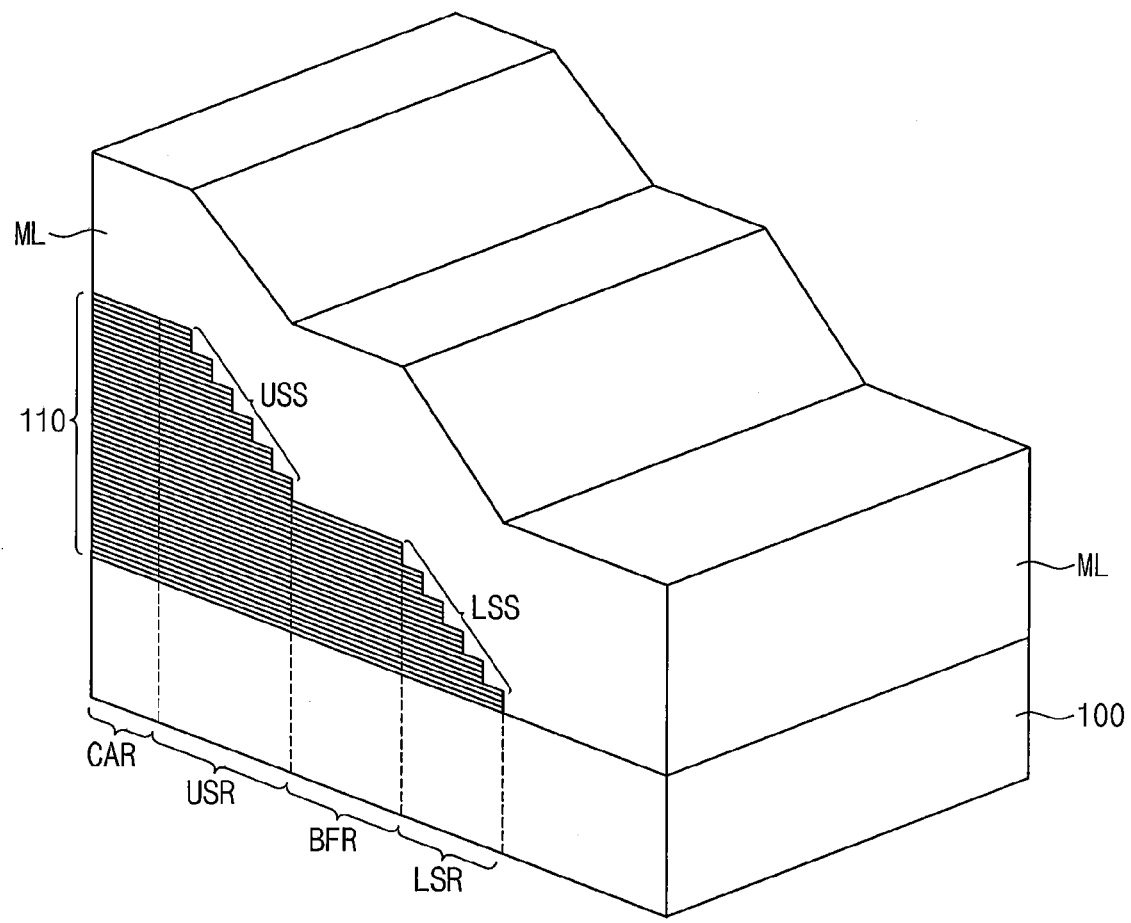

Next, as shown in FIG. 7, a third mask layer ML may be formed to cover the stack 110 provided with the upper and lower staircase structures USS and LSS. The third mask layer ML may be a photoresist layer formed using, for example, a spin-coating technique. As will be described below in more detail with reference to FIGS. 15 through 20, the third mask layer ML may be formed to have a position-dependent varying thickness, because the stack 110 is formed to have the lower and upper staircase structures LSS and USS. However, according to some example embodiments of the inventive concepts, the variation in thickness of the third mask layer ML may be reduced or prevented due to the presence of the buffer region BFR.

Figure 8:
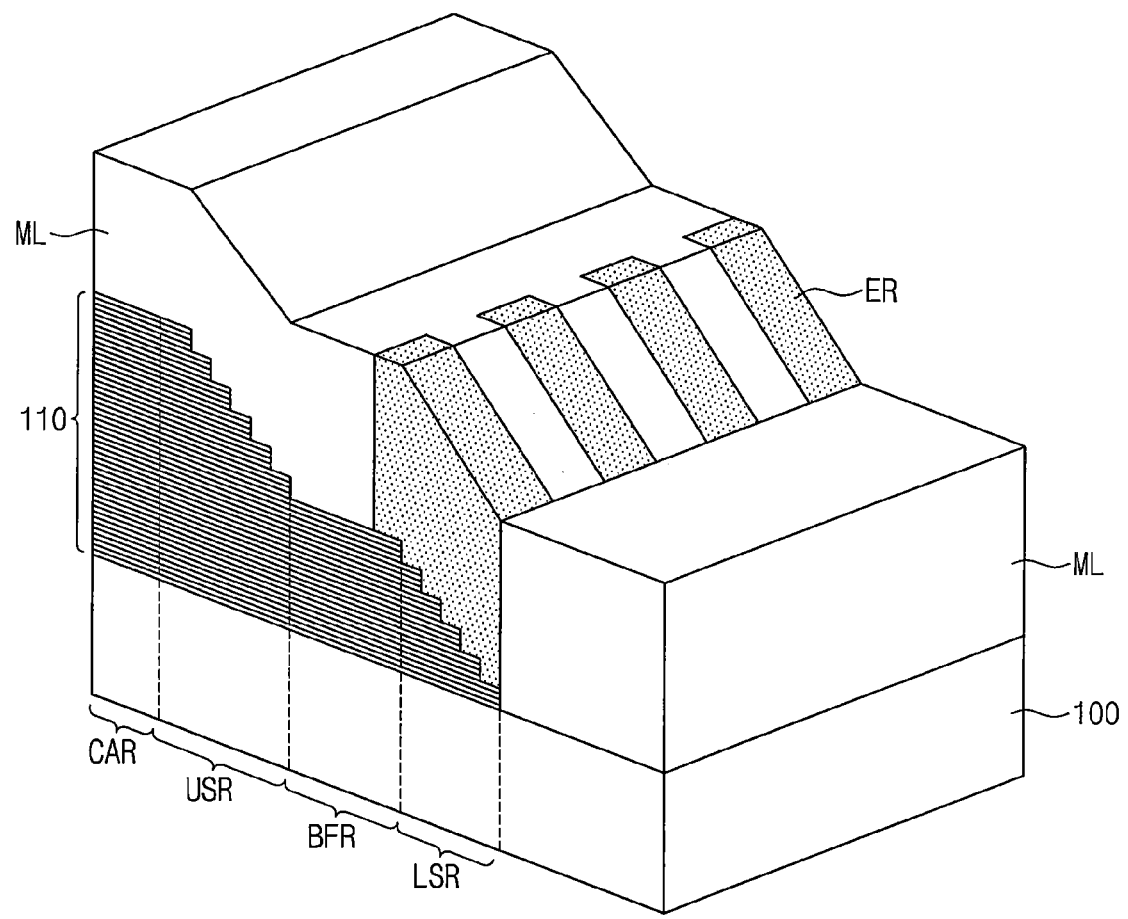
Figure 9:
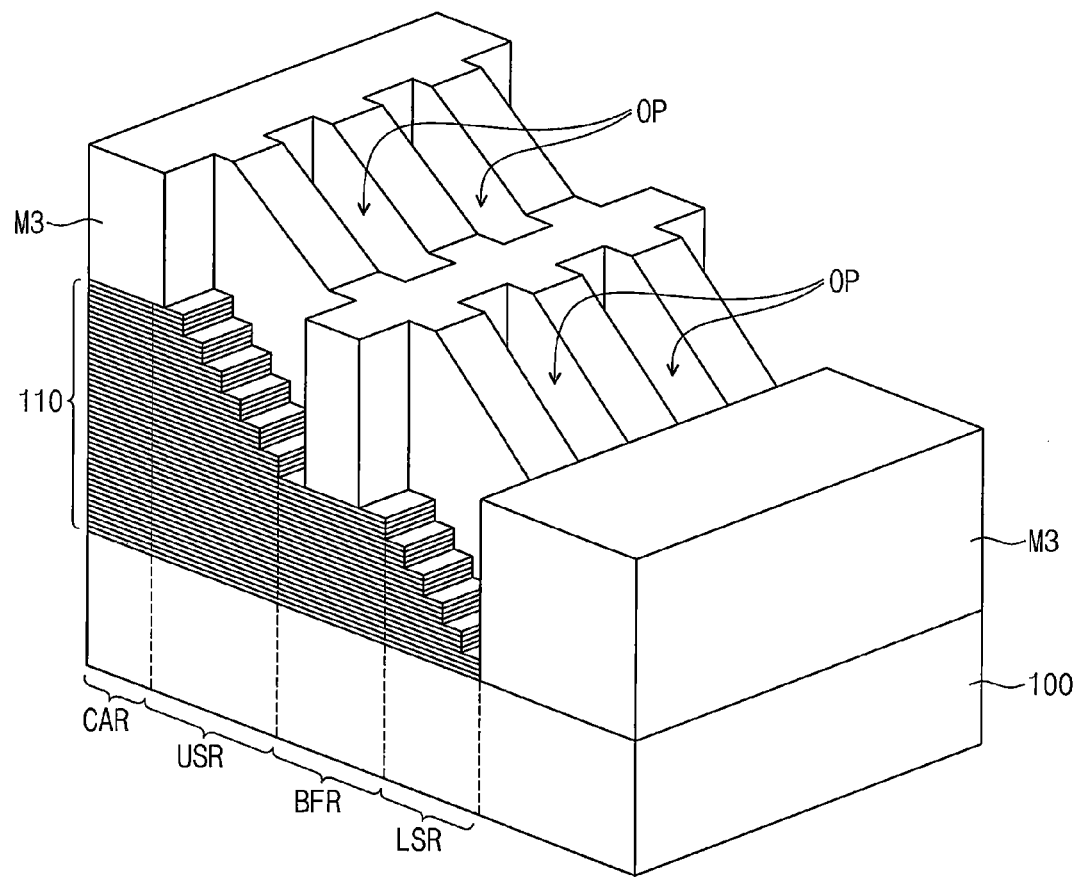

Referring to FIGS. 8 and 9, a photolithography process may be performed on the third mask layer ML to form a third mask pattern M3 with openings OP. The openings OP may be formed to partially expose the upper and lower staircase structures USS and LSS. In some example embodiments, the formation of the third mask pattern M3 may include two exposure steps, which may be successively performed on the third mask layer ML, and one developing step.

For example, one of the exposure steps may be performed to expose portions of the third mask layer ML that are located on the lower staircase structure LSS and thus, as shown in FIG. 8, first exposed regions ER may be formed in a portion of the third mask layer ML located on the lower staircase structure LSS. Each of the first exposed regions ER may be formed across the lower staircase structure LSS and may include a portion overlapping the buffer region BFR.

The other one of the exposure steps may be performed to expose other portions of the third mask layer ML that are located on the upper staircase structure USS, and thus, second exposed regions (not shown) may be formed in the other portions of the third mask layer ML located on the upper staircase structure USS. Each of the second exposed regions may be formed across the upper staircase structure and may include a portion overlapping the buffer region BFR. There may be differences in process conditions, such as a focal length, between the exposure steps for forming the first and second exposed regions. For example, the exposed regions (e.g., the first exposed regions ER) on the lower staircase region LSR may be formed under process conditions in which a focal length is longer than in a process for forming the exposed regions (e.g., the second exposed regions) on the upper staircase region USR.

The first exposed regions ER may be formed spaced apart from the second exposed regions, with the buffer region BFR interposed therebetween. Accordingly, when the developing step is finished, the third mask pattern M3 may have the openings OP spaced apart from each other with the buffer region BFR interposed therebetween, as shown in FIG. 9.

Figure 10:
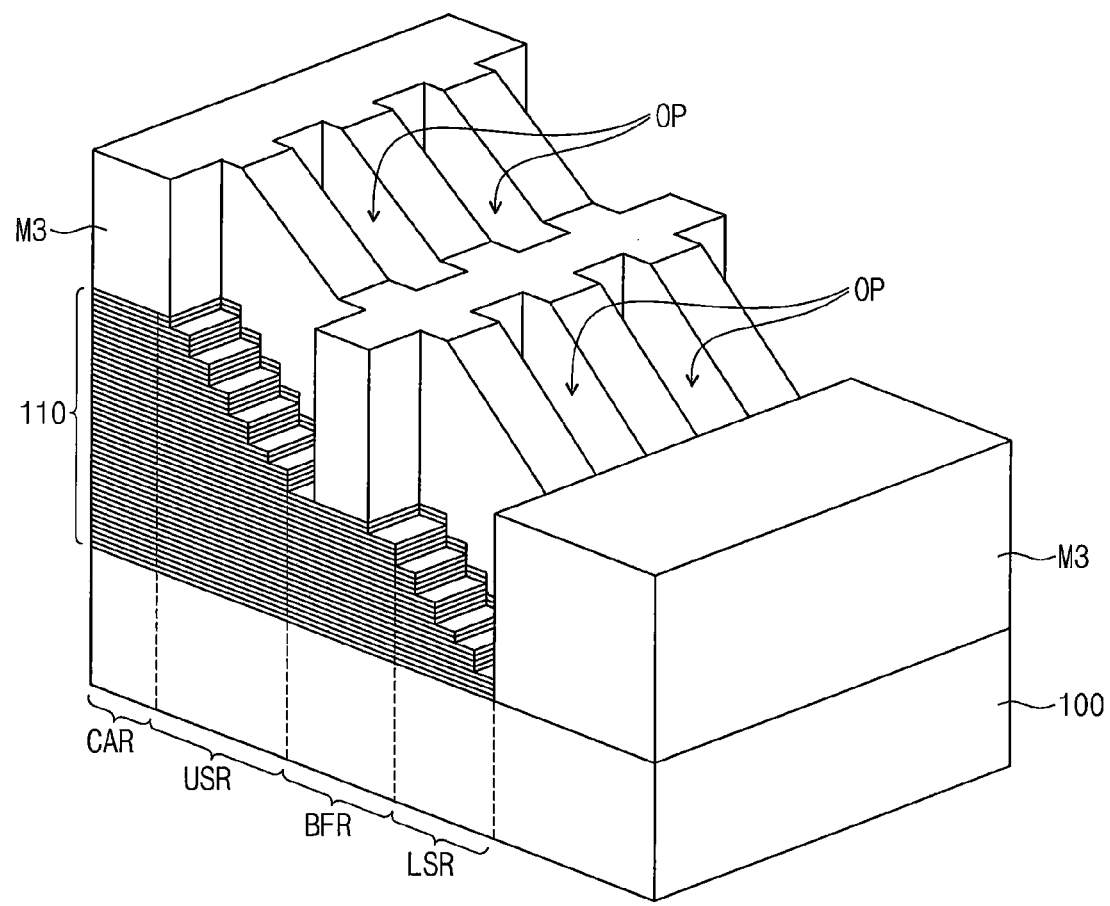

Next, as shown in FIG. 10, the horizontal layers 114 exposed by the openings OP may be etched by a third etching step using the third mask pattern M3 as an etch mask. When it comes to an etch depth, the third etching step may be performed to etch one of the horizontal layers 114. For example, the etch depth of the third etching step may be substantially equal to or smaller than a vertical pitch of each of the horizontal layers 114. Accordingly, at least one single-level stair may be formed in each of the multi-level stairs constituting the upper and lower staircase structures USS and LSS. This etching method may be referred to as a "single-layer etching method" below.

Figure 11:
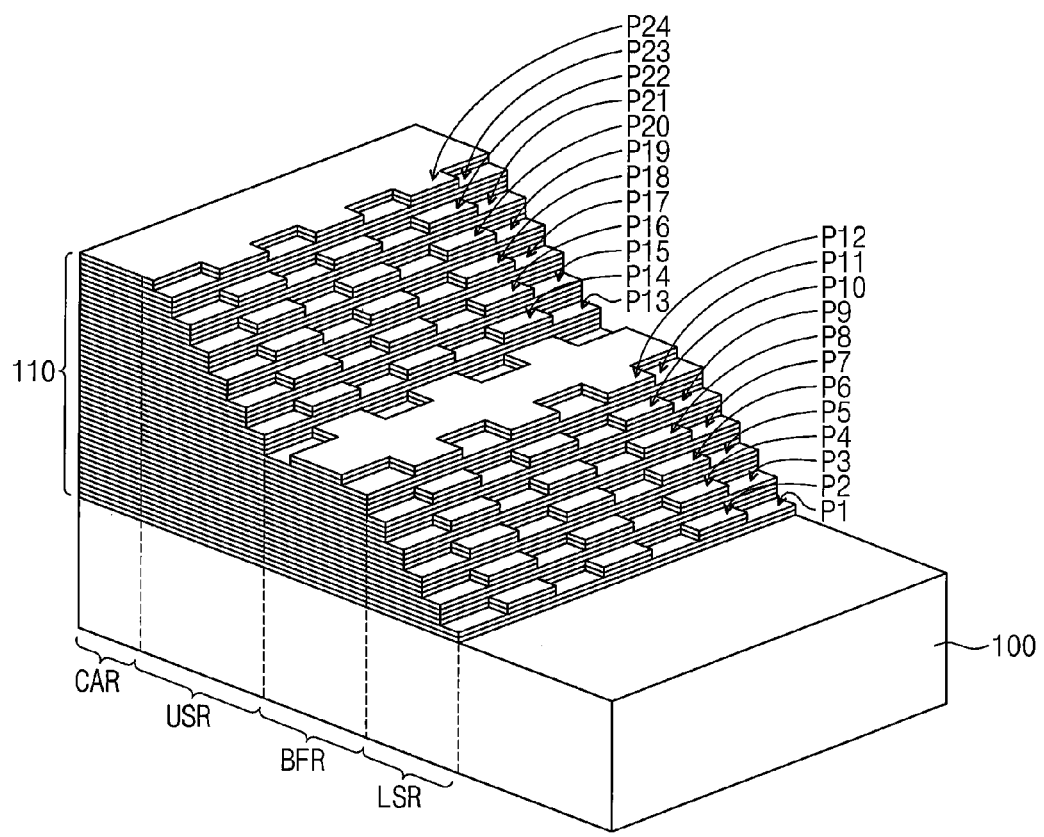

The third mask pattern M3 may be removed. As shown in FIG. 11, the stack 110 may be formed to have pads P1-P24 having respectively different vertical and horizontal positions. Thereafter, additional processes required for fabricating a three-dimensional memory semiconductor device may be further performed on the stack 110 with the staircase-shaped connection structure.

Figure 12A:
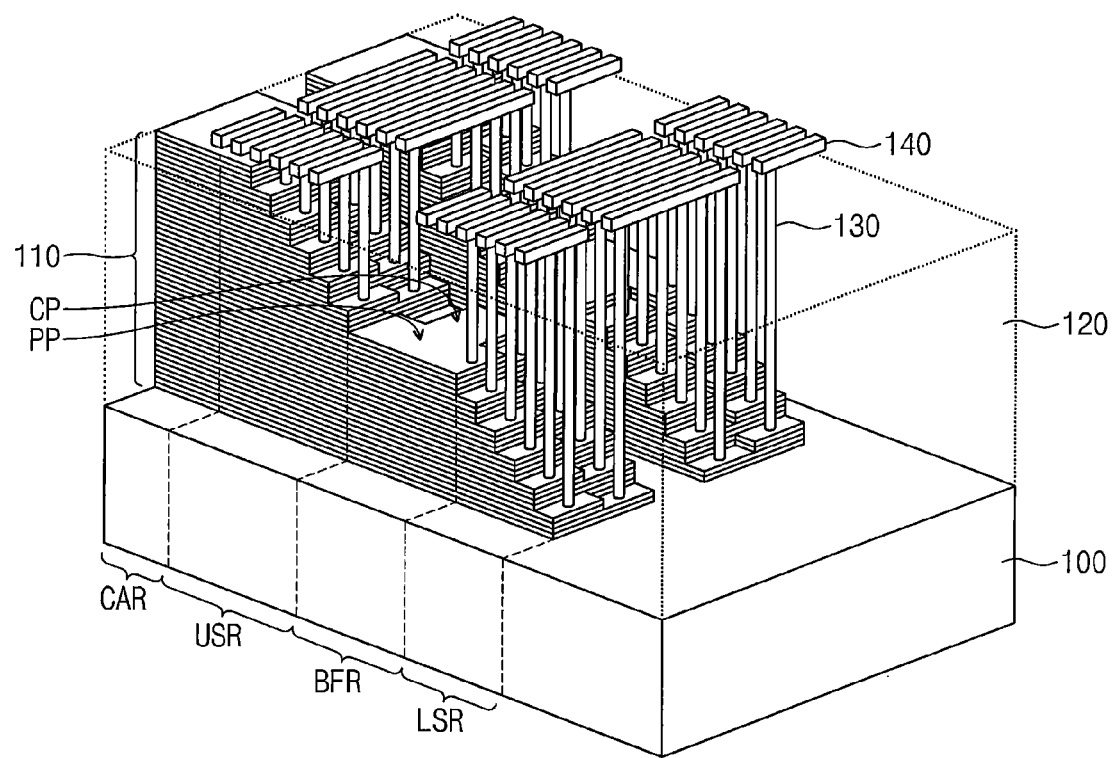

For example, as shown in FIG. 12A, an insulating layer 120 may be formed to cover the stack 110; cutting regions may be formed across the stack 110, and then, vertical patterns may be formed to penetrate the stack 110. The vertical patterns will be described below in more detail with reference to FIGS. 22 through 25. Thereafter, contact plugs 130 may be formed on the upper and lower staircase regions USR and LSR, and upper interconnection lines may be connected to the contact plugs 130. The contact plugs 130 may be respectively connected to the horizontal layers 114, which are separated from each other by the cutting regions. In some example embodiments, before the formation of the contact plugs 130, the horizontal layers 114 may be replaced with a conductive material through a replacement process. In this case, the contact plugs 130 may be respectively connected to conductive patterns, which are formed in place of the horizontal layers 114.

As shown in FIG. 12A, a three-dimensional semiconductor device according to example embodiments of the inventive concepts may include the electrode structure 110 provided on the substrate 100. The electrode structure 110 may include horizontal electrodes sequentially stacked on the substrate 100, when viewed in a section view, and may include the upper staircase region USR, the lower staircase region LSR, and the buffer region BFR therebetween, when viewed in a plan view. The horizontal electrodes may have a plurality of pad regions (for example, P1 to P24 of FIG. 11), which constitute a staircase structure in each of the upper and lower staircase regions USR and LSR. Here, the buffer region BFR may be formed to have a width greater than the pad regions. For example, the width of the buffer region BFR may be 3 to 150 times the width of each of the pad regions.

In some example embodiments, a thickness of the buffer region BFR may be smaller than or equal to the minimum thickness of the upper staircase region USR and may be greater than or equal to the maximum thickness of the lower staircase region LSR. For example, the buffer region BFR may be substantially coplanar with the lower staircase region LSR.

The three-dimensional semiconductor device may further include the insulating layer 120 covering the electrode structure 110. The insulating layer 120 may be provided to cover the whole top surface of the buffer region BFR, except for the contact plugs 130 penetrating the insulating layer 120, and to have a substantially flat top surface. For example, any pattern made of the same material as the horizontal electrodes may not be provided between the buffer region BFR and the insulating layer 120. Accordingly, the insulating layer 120 may have a monotonically increasing thickness in a direction from the upper staircase region USR toward the lower staircase region LSR. For example, the whole top surface of the buffer region BFR, except for the contact plugs 130 penetrating the insulating layer 120, may be in direct contact with the insulating layer 120.

A thickness of each of the upper and lower staircase regions USR and LSR may decrease several times in a stepwise manner in a direction away from the cell array region CAR. Each of the upper and lower staircase regions USR and LSR may have at least two different thicknesses, which are changed in an alternating manner when measured at the same distance from the cell array region CAR.

When viewed in a plan view, the uppermost one of the horizontal electrodes constituting the buffer region BFR may include a connecting portion CP continuously extending from the upper staircase region USR to the lower staircase region LSR and a protruding portion PP horizontally protruding from the connecting portion CP. The protruding portion PP may be spaced apart from one or both of the upper and lower staircase regions USR and LSR. For example, the uppermost one of the horizontal electrodes constituting the buffer region BFR may be formed to have a 'T'-shaped structure, when viewed in a plan view.

Figure 12B:
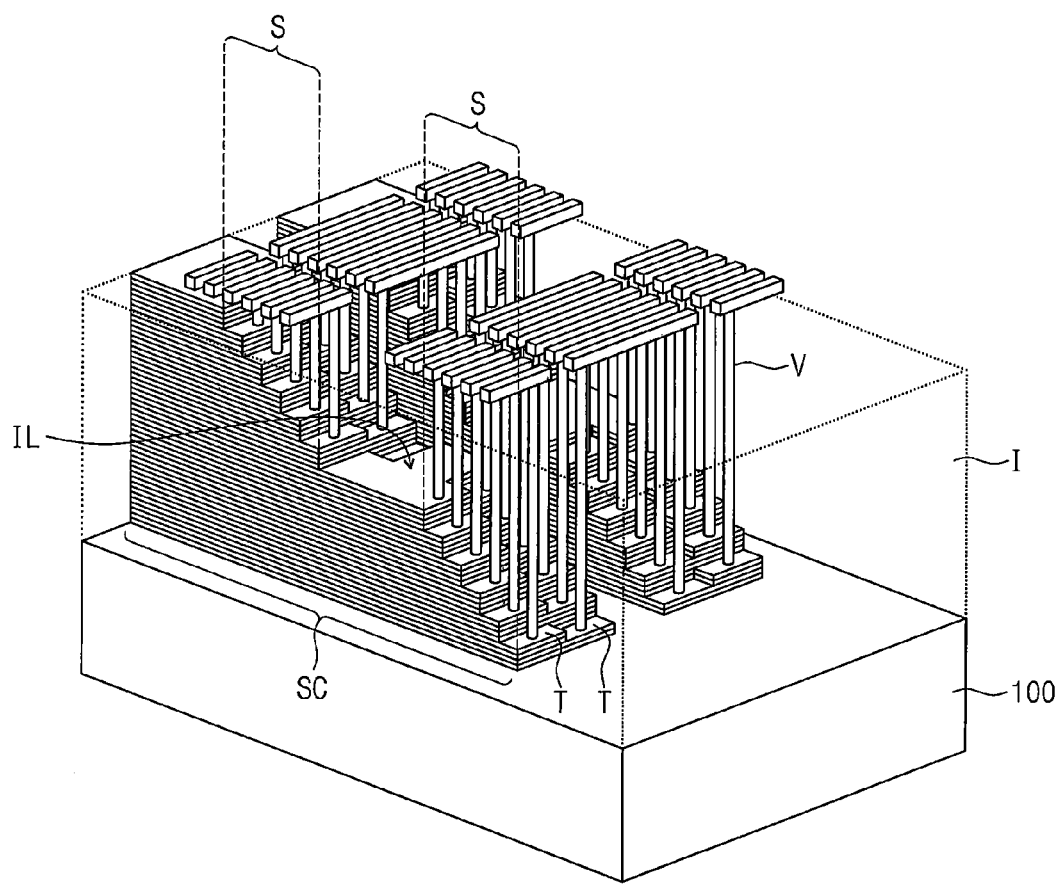

FIG. 12B corresponds to FIG. 12A, but uses conventional staircase terminology. As shown in FIG. 12B, at least one of the conductive treads T includes multiple levels. Moreover, a plurality of conductive vias V are provided, a respective one of which electrically contacts a respective one of the conductive treads T and extends away from the respective one of the conductive treads T. An insulating layer I is also provided on the staircase SC. The insulating layer I includes a flat outer surface on the steps S and a flat outer surface on the intermediate landing IL. As also shown, the insulating layer I increases in thickness going down the steps S of the staircase SC.

Figure 13:
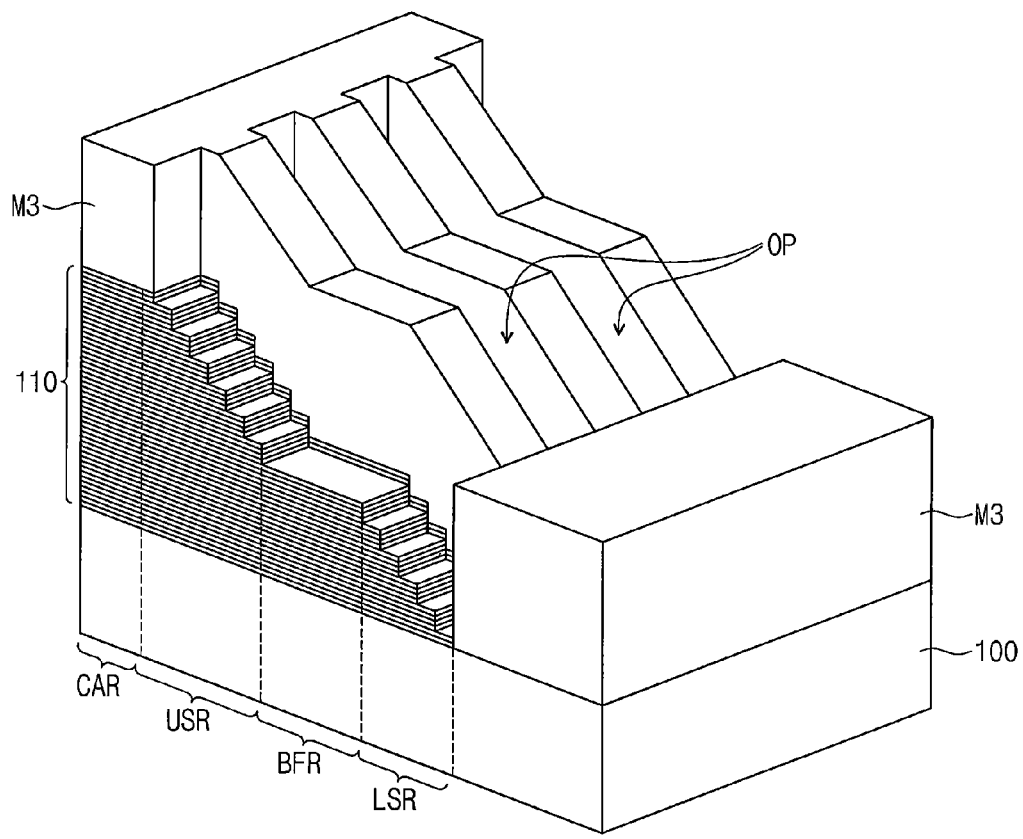
FIGS. 13 and 14 are perspective views illustrating a method of forming a staircase-shaped connection structure according to other example embodiments of the inventive concepts.
Figure 14:
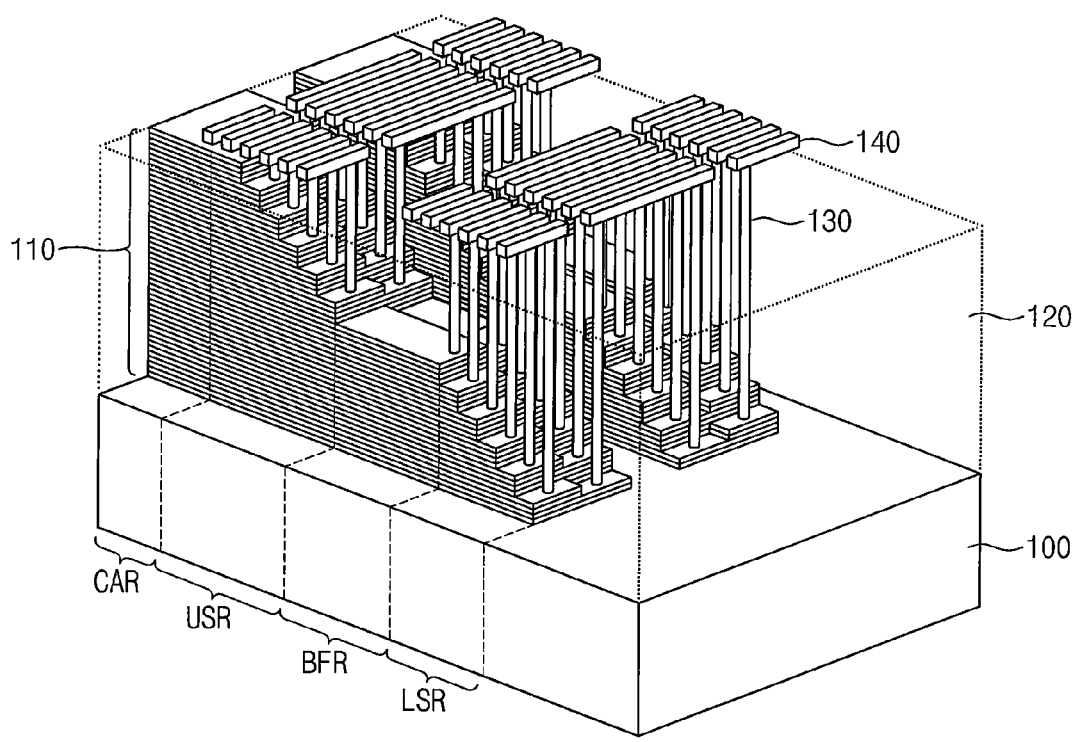

FIGS. 13 and 14 are perspective views illustrating a method of forming a staircase-shaped connection structure according to other example embodiments of the inventive concepts. For concise description, an element previously described with reference to FIGS. 1 through 12 may be identified by a similar or identical reference number without repeating an overlapping description thereof.

Referring to FIGS. 7 and 13, a photolithography process may be performed on the third mask layer ML to form the third mask pattern M3 with openings OP. The openings OP may be formed to partially expose the upper and lower staircase structures USS and LSS. In the present embodiments, the formation of the third mask pattern M3 may include one exposure step and one developing step, which may be performed on the third mask layer ML. Each of the openings OP may be formed across the buffer region BFR and expose both of the upper and lower staircase structures USS and LSS.

Next, the horizontal layers 114 exposed by the openings OP may be etched by a third etching step using the third mask pattern M3 as an etch mask. With regard to an etch depth, the third etching step may be performed using the single-layer etching method. For example, the etch depth of the third etching step may be substantially equal to or smaller than the vertical pitch of each of the horizontal layers 114. Accordingly, at least one single-level stair may be formed in each of the multi-level stairs constituting the upper and lower staircase structures USS and LSS. Since each of the openings OP is formed across the buffer region BFR, the single-level stair may be formed not only on the upper and lower staircase structures USS and LSS but also on the buffer region BFR, as shown in FIG. 14.

Referring to FIG. 14, when viewed in a plan view, the uppermost one of the horizontal electrodes constituting the buffer region BFR may continuously extend from the upper staircase region USR to the lower staircase region LSR and continuously expose the second uppermost one of the horizontal electrodes from the upper staircase region USR to the lower staircase region LSR. For example, the uppermost one of the horizontal electrodes constituting the buffer region BFR may have a bar shape.

Figure 15:
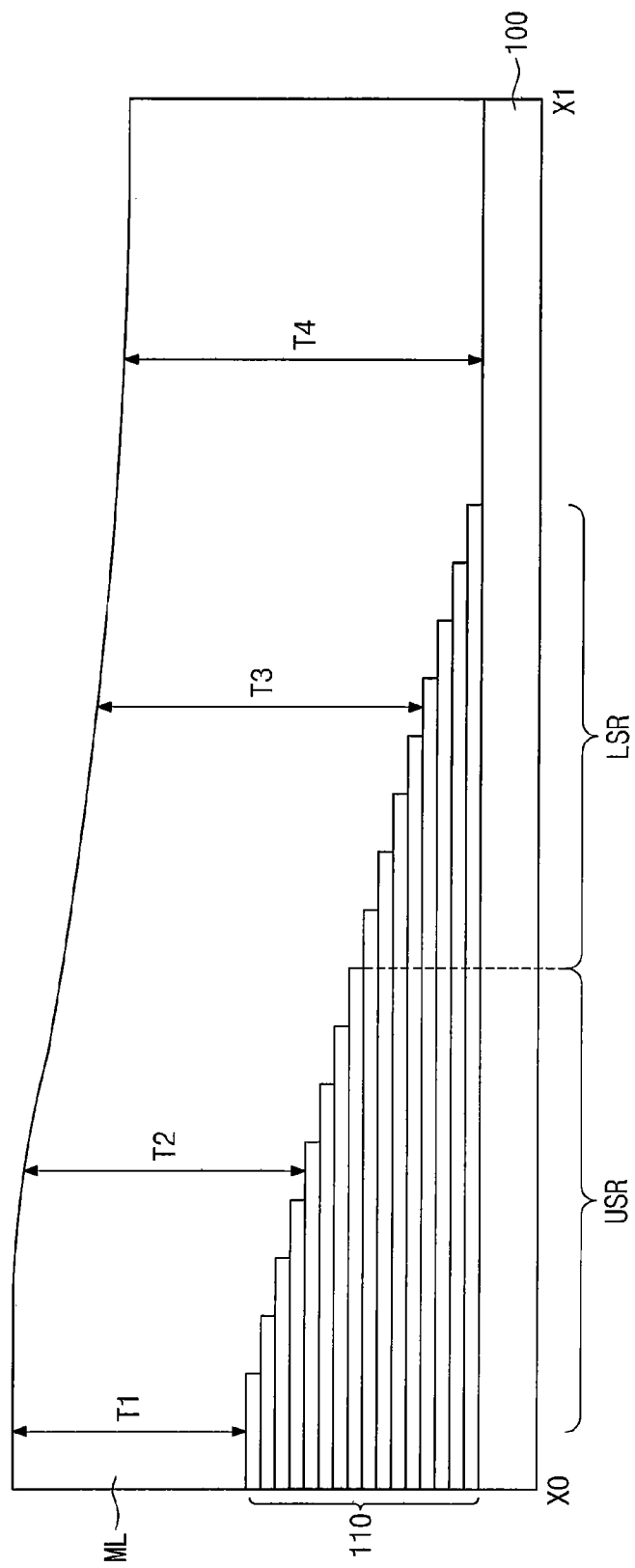
FIG. 15 is a sectional view illustrating a coated profile of a photoresist layer according to a comparative example.
Figure 16:
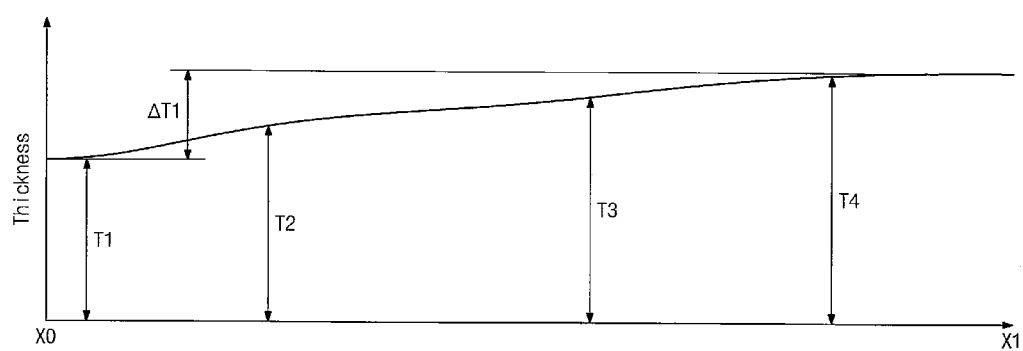
FIG. 16 is a graph showing a change in thickness of a photoresist layer with respect to position in the comparative example.

FIG. 15 is a sectional view illustrating a coated profile of a photoresist layer according to a comparative example, and FIG. 16 is a graph showing a change in thickness of a photoresist layer with respect to position in the comparative example.

According to the comparative example, as shown in FIGS. 15 and 16, the buffer region BFR may not be formed between the upper and lower staircase regions USR and LSR, and thus, the upper and lower staircase regions USR and LSR may be formed adjacent to each other. In this case, as shown in FIG. 16, the third mask layer ML may have an increasing thickness in a direction from the cell array region CAR toward the lower staircase region LSR (for example, T1<T2<T3<T4). Accordingly, in the case where the number of layers constituting the stack 110 increases, the third mask layer ML may have an increased thickness variation ΔT1 between the upper and lower staircase regions USR and LSR.

Since an exposure step can only be effectively performed within a specific range of focal length, the increase in thickness variation ΔT1 of the third mask layer ML makes it difficult to expose effectively both of the upper and lower staircase regions USR and LSR through a single exposure step. In other words, in the case where the buffer region BFR is absent, the thickness variation ΔT1 may be too large to effectively expose the third mask layer ML through one exposure step. Furthermore, in the case where the buffer region BFR is absent, the thickness variation ΔT1 of the third mask layer ML may be excessive. In this case, the photolithography process may not be effectively performed on the third mask layer ML.

Figure 17:
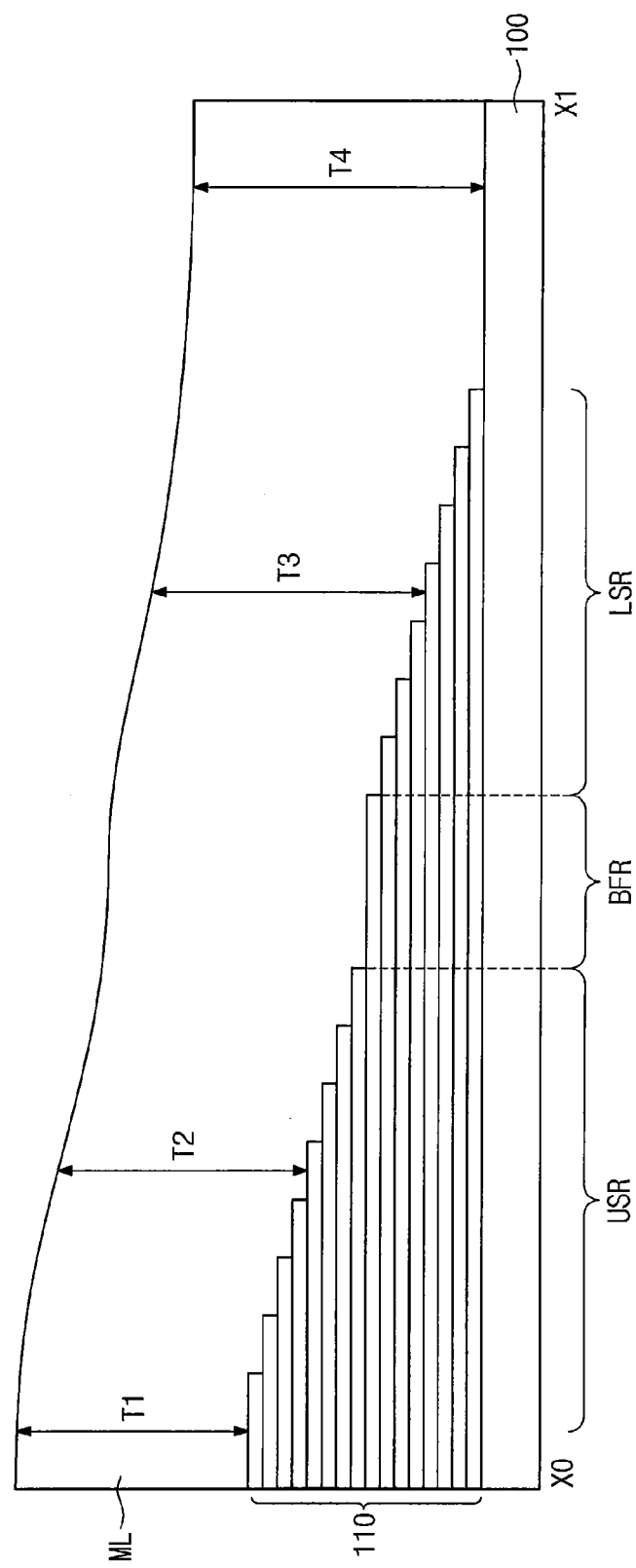
FIG. 17 is a sectional view illustrating a coated profile of a photoresist layer according to example embodiments of the inventive concepts.
Figure 18:
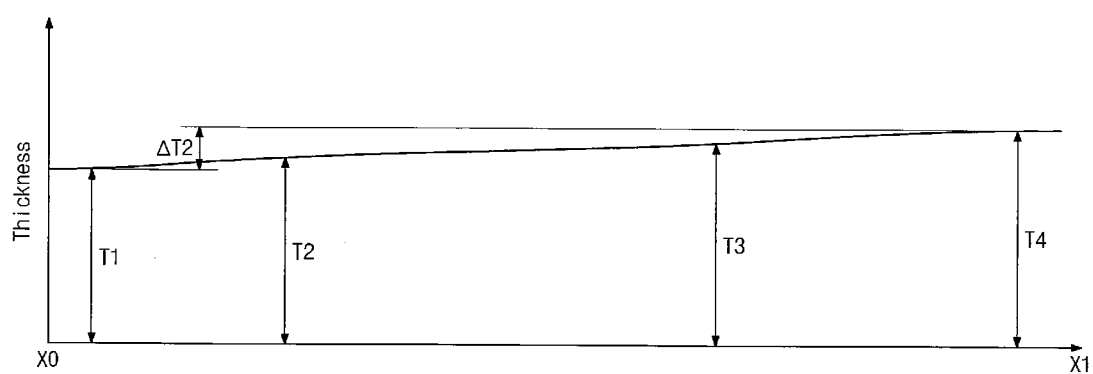
FIG. 18 is a graph showing a change in thickness of a photoresist layer with respect to position example embodiments of the inventive concepts.
Figure 19:
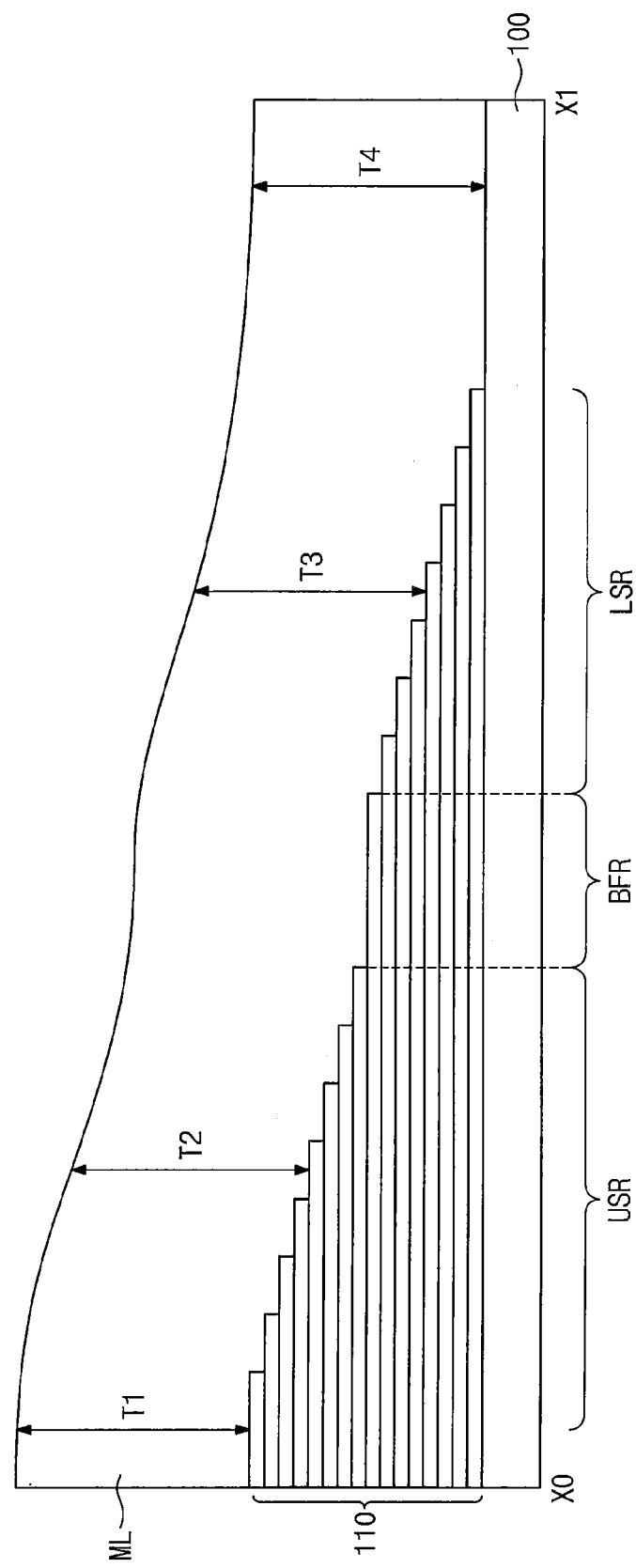
FIG. 19 is a sectional view illustrating a coated profile of a photoresist layer according to other example embodiments of the inventive concepts.
Figure 20:
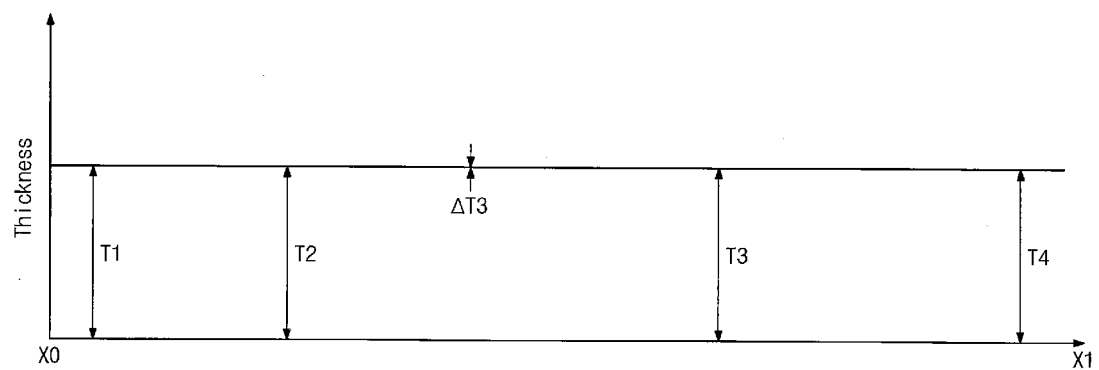
FIG. 20 is a graph showing a change in thickness of a photoresist layer with respect to position according to other example embodiments of the inventive concepts.

FIG. 17 is a sectional view illustrating a coated profile of a photoresist layer according to example embodiments of the inventive concepts, and FIG. 18 is a graph showing a change in thickness of a photoresist layer with respect to position example embodiments of the inventive concepts. FIG. 19 is a sectional view illustrating a coated profile of a photoresist layer according to other example embodiments of the inventive concepts, and FIG. 20 is a graph showing a change in thickness of a photoresist layer with respect to position according to other example embodiments of the inventive concepts.

According to example embodiments of the inventive concepts, the buffer region BFR may be provided between the upper and lower staircase regions USR and LSR. Accordingly, when compared with the case of the absence of the buffer region BFR, the third mask layer ML may have a reduced thickness variation ΔT2 (i.e., ΔT2<ΔT1), as shown in FIGS. 17 and 18 or a substantially uniform thickness (i.e., ΔT3~0), as shown in FIGS. 19 and 20. In other words, the presence of the buffer region BFR makes it possible to improve uniformity in thickness of the third mask layer ML. Accordingly, as described with reference to FIGS. 13 and 14, the openings OP may be formed at once by one exposure step and one developing step to cross both of the upper and lower staircase regions USR and LSR.

Alternatively, as described with reference to FIGS. 1 through 12, the openings OP may be formed by two exposure steps and one developing step to expose the upper and lower staircase regions USR and LSR, respectively. Especially, as shown in FIG. 9, in the case that there is the buffer region BFR, some of the openings OP exposing the upper staircase regions USR may be formed spaced apart from the others of the openings OP exposing the lower staircase regions LSR. In other words, the two exposure steps may be performed in such a way that regions exposed thereby are not overlapped with each other.

By contrast, if the buffer region BFR is not provided as described in the comparative example of FIG. 15, in order to apply the single-layer etching method to all of the multi-level stairs constituting the stack 110, at least two exposure steps should be performed in such a way that regions exposed thereby are overlapped with each other in at least one portion. However, such an overlap between the exposed regions may lead to technological problems such as an over-dose problem, and this makes it difficult to realize a desired shape of the opening OP.

Figure 21:
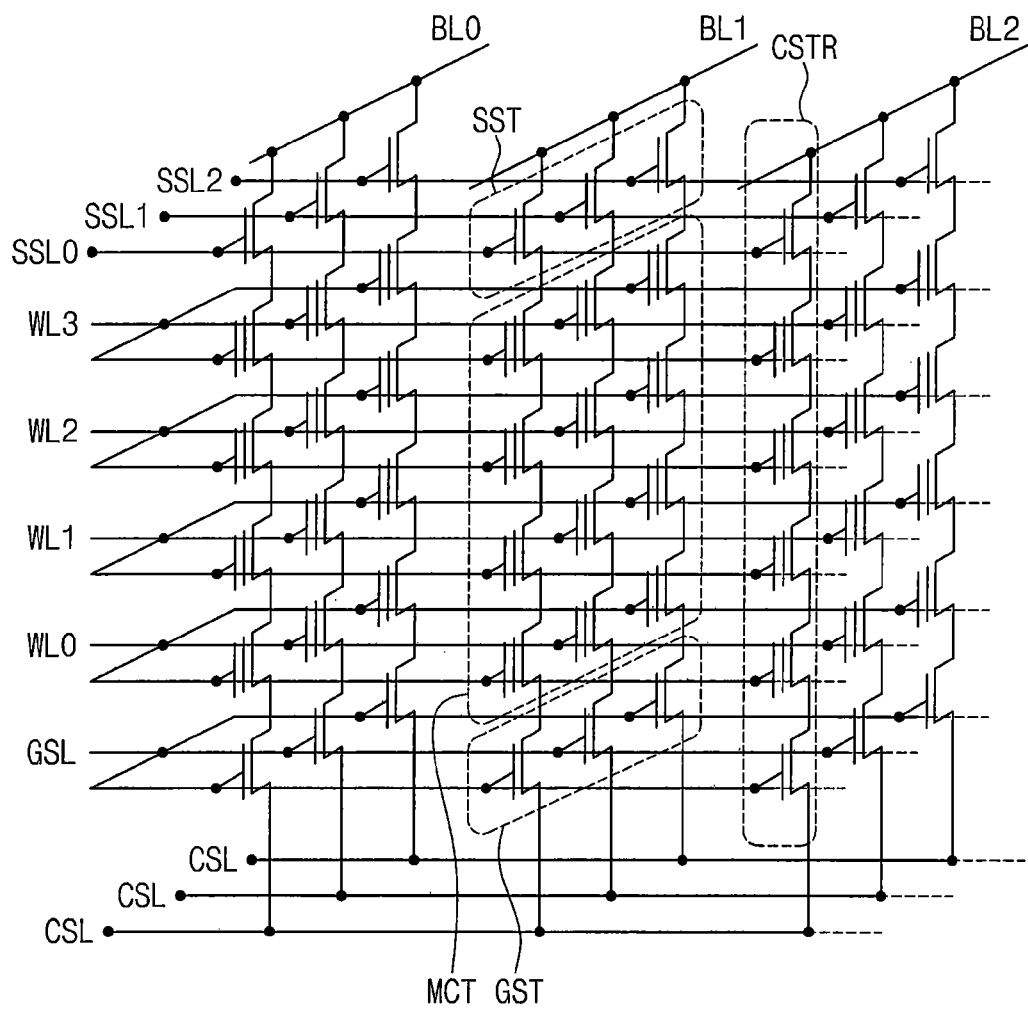
FIG. 21 is a circuit diagram illustrating a three-dimensional semiconductor memory device according to example embodiments of the inventive concepts.

FIG. 21 is a circuit diagram illustrating a three-dimensional semiconductor memory device according to example embodiments of the inventive concepts.

Referring to FIG. 21, a three-dimensional semiconductor memory device may include a common source line CSL, a plurality of bit lines BL0, BL1, and BL2, and a plurality of cell strings CSTR disposed between the common source line CSL and the bit lines BL0-BL2.

The common source line CSL may be a conductive pattern provided on the substrate 10 or a doped region provided in the substrate 100. The bit lines BL0-BL2 may be conductive patterns (for example, metal lines) provided over the substrate 100. The bit lines BL0-BL2 may be spaced apart from and parallel to each other, and a plurality of cell strings CSTR may be connected in parallel to each of the bit lines BL0-BL2. Accordingly, the cell strings CSTR may also be two-dimensionally provided on the common source line CSL or the substrate 100.

Each of the cell strings CSTR may include a ground selection transistor GST coupled to the common source line CSL, a string selection transistor SST coupled to one of the bit lines BL0-BL2, and a plurality of memory cell transistors MCT disposed between the ground and string selection transistors GST and SST. The ground selection transistor GST, the string selection transistor SST, and the memory cell transistors MCT may be connected in series to each other. Furthermore, a ground selection line GSL, a plurality of word lines WL0-WL3 and a plurality of string selection lines SSL0-SSL2 may be provided between the common source line CSL and the bit lines BL0-BL2 to serve as gate electrodes of the ground selection transistor GST, the memory cell transistors MCT, and the string selection transistors SST, respectively.

The ground selection transistors GST may be disposed at the substantially same level (for example, relative to the substrate 100), and the gate electrodes thereof may be connected in common to the ground selection line GSL, thereby being in an equipotential state. Similarly, the gate electrodes of the memory cell transistors MCT located at the same level may be connected in common to one of the word lines WL0-WL3, thereby being in an equipotential state. Since each of the cell strings CSTR includes a plurality of the memory cell transistors MCT disposed at different levels from each other, the word lines WL0-WL3 may have a multi-layered structure between the common source line CSL and the bit lines BL0-BL2. The word lines WL0-WL3 of the multi-layered structure may be configured to have substantially the same technical features as those of the semiconductor devices previously described with reference to FIG. 12A and FIG. 14.

Each of the cell strings CSTR may include a semiconductor pattern vertically extending from the common source line CSL to be connected to one of the bit line BL0-BL3. A memory layer or a memory element may be provided between the word lines WL0-WL3 and the semiconductor pattern. In example embodiments, the memory layer or the memory element may include a material or a layer structure, in which electric charges can be selectively stored. For example, the memory layer may include an insulating layer with many trap sites (e.g., a silicon nitride layer), a floating gate electrode, and/or an insulating layer provided with conductive nano dots.

For example, each of the cell strings CSTR may include horizontal patterns HP, which are vertically separated from each other by the interlayered insulating layers 112, and vertical patterns VP, which are provided to penetrate the horizontal patterns HP. The vertical patterns VP and the horizontal patterns HP may be formed to have one of several structures illustrated in FIGS. 22 through 25. In the case of the embodiments previously described with reference to FIGS. 1 through 14, the horizontal patterns HP may be the horizontal layers 114. Alternatively, the horizontal patterns HP may be provided as the resulting structure of the replacement process performed on the horizontal layers 114. Accordingly, the horizontal patterns HP may be configured to have the same features as the staircase-shaped structure shown in FIGS. 12 and 14.

Referring to FIGS. 22 through 25, the vertical pattern VP may include a semiconductor pattern SP serving as a channel region, and the horizontal pattern HP may include a horizontal electrode HE serving as a gate electrode. In example embodiments, the vertical pattern VP may further include a vertical insulating layer VI that is inserted into the semiconductor pattern SP. Furthermore, each of the memory cell transistors MCT may further include a tunnel insulating layer TL, a charge storing layer CL, and a blocking insulating layer BK that constitute a memory element.

Figure 22:
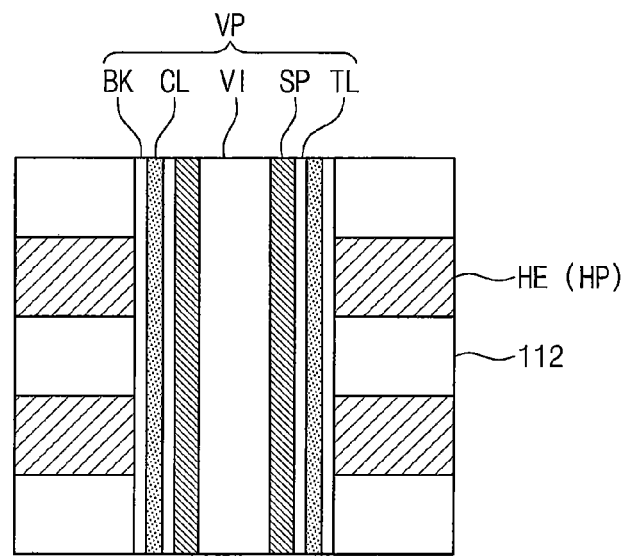
FIGS. 22 through 25 are sectional views illustrating portions of three-dimensional semiconductor memory devices according to example embodiments of the inventive concepts.
Figure 23:
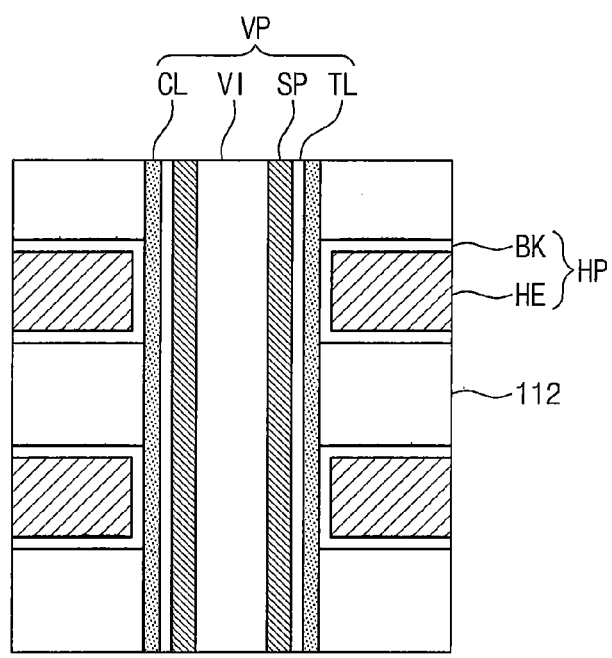
Figure 24:
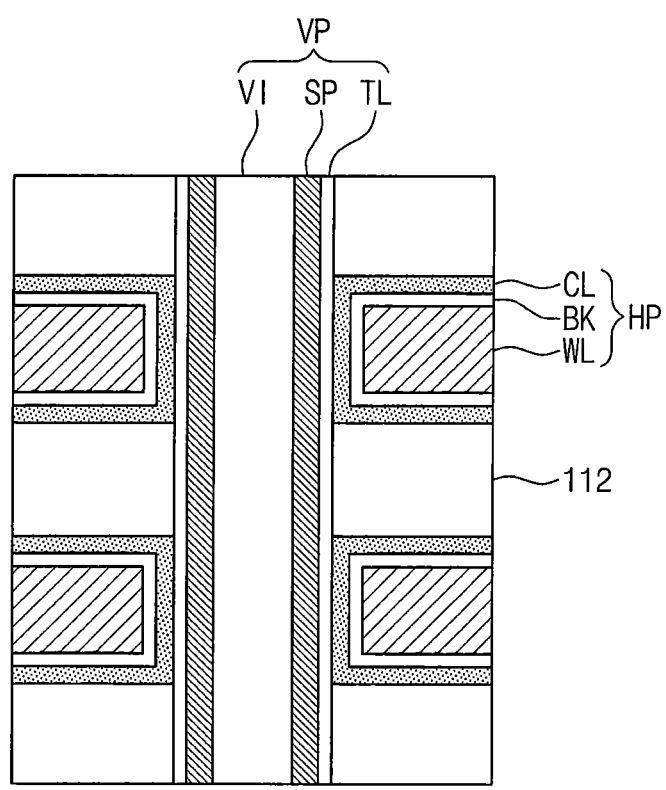
Figure 25:
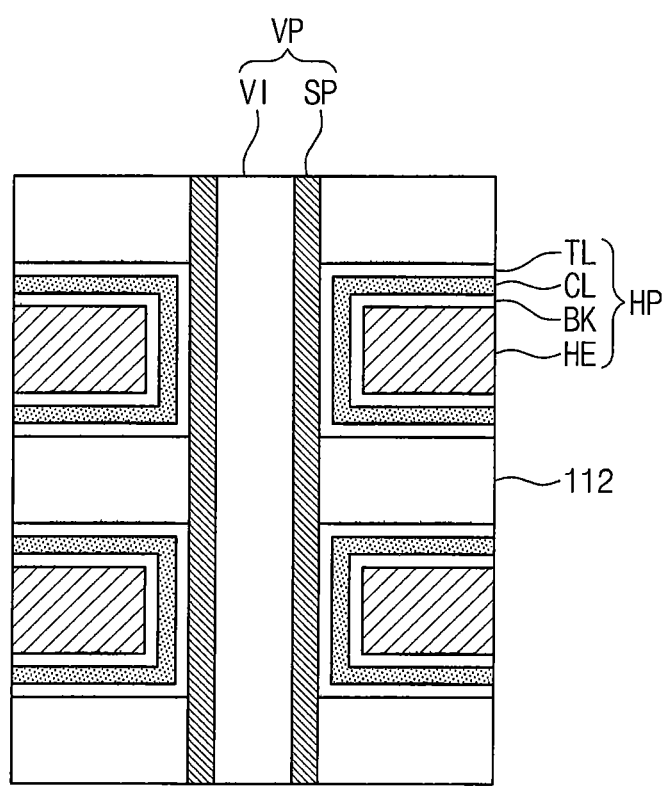

In example embodiments, as shown in FIG. 22, the tunnel insulating layer TL, the charge storing layer CL, and the blocking insulating layer BK may constitute the vertical pattern VP. In other embodiments, as shown in FIG. 25, the tunnel insulating layer TL, the charge storing layer CL, and the blocking insulating layer BK may constitute the horizontal pattern HP. In other embodiments, as shown in FIG. 23, the tunnel insulating layer TL and the charge storing layer CL may constitute the vertical pattern VP, and the blocking insulating layer BK may constitute the horizontal pattern HP. In still other embodiments, as shown in FIG. 24, the tunnel insulating layer TL may constitute the vertical pattern VP, and the charge storing layer CL and the blocking insulating layer BK may constitute the horizontal pattern HP. However, example embodiments of the inventive concepts will not be limited to the examples shown in FIGS. 22 through 25. For example, at least one of the tunnel insulating layer TL, the charge storing layer CL, and the blocking insulating layer BK may be provided in a multi-layered structure. Furthermore, the multi-layered structure may be configured to include layers, at least one of which is included in the vertical pattern VP and the other of which is included in the horizontal pattern HP.

The charge storing layer CL may be an insulating layer with many trap sites and/or an insulating layer with nano particles and may be formed by a chemical vapor deposition and/or atomic layer deposition process. For example, the charge storing layer CL may include a trap insulating layer, a floating gate electrode, and/or an insulating layer with conductive nano dots. In example embodiments, the charge storing layer CL may include a silicon nitride layer, a silicon oxynitride layer, a silicon-rich nitride layer, a nanocrystalline silicon layer, and/or a laminated trap layer.

The tunnel insulating layer TL may be one or more materials having a greater band gap than the charge storing layer CL and be formed by a chemical vapor deposition and/or atomic layer deposition process. For example, the tunnel insulating layer TL may be a silicon oxide layer, which may be formed using one of the above deposition techniques. Furthermore, a thermal treatment process may be further performed on the tunnel insulating layer TL, for example, after the deposition thereof. The thermal treatment may be a rapid thermal nitridation (RTN) process and/or an annealing process to be performed under atmosphere containing at least one of nitrogen and oxygen.

The blocking insulating layer BK may include the first and second blocking insulating layers that are formed of different materials from each other. In example embodiments, one of the first and second blocking insulating layers may be configured to have a band gap that is smaller than that of the tunnel insulating layer TL and higher than that of the charge storing layer CL. Further, the first and second blocking insulating layers may be formed using a chemical vapor deposition and/or an atomic layer deposition, and one of them may be formed by a wet oxidation process. In example embodiments, the first blocking insulating layer may include a high-k dielectric, such as aluminum oxide and/or hafnium oxide, and the second blocking insulating layer may be a material, whose dielectric constant is smaller than the first blocking insulating layer. In other embodiments, the second blocking insulating layer may be one or more high-k dielectrics, and the first blocking insulating layer may be a material, whose dielectric constant is smaller than the second blocking insulating layer.

Figure 26:
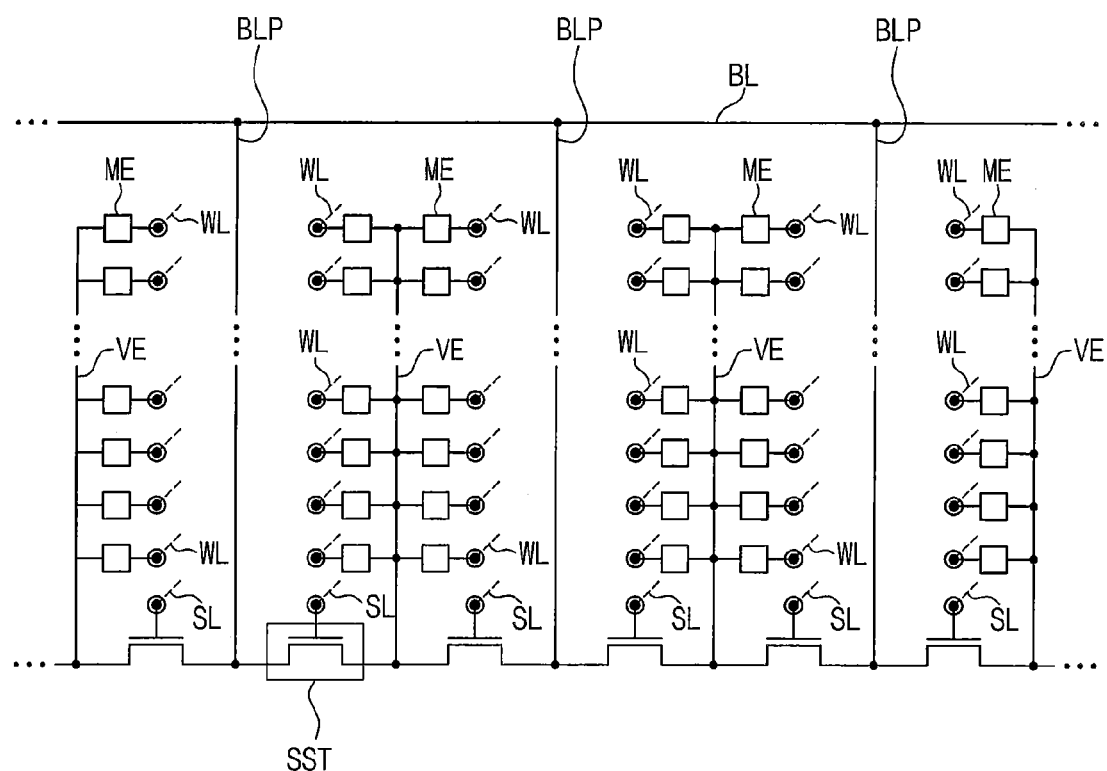
FIG. 26 is a circuit diagram illustrating a three-dimensional semiconductor memory device according to other example embodiments of the inventive concepts.

FIG. 26 is a circuit diagram illustrating a three-dimensional semiconductor memory device according to other example embodiments of the inventive concepts.

Referring to FIG. 26, a plurality of selection transistors SST may be connected in parallel to a bit line BL via a plurality of bit line plugs BLP. Each of the bit line plugs BLP may be connected in common to a pair of the selection transistors SST disposed adjacent thereto.

A plurality of word lines WL and a plurality of vertical electrodes VE may be provided between the bit line BL and the selection transistors SST. The word lines WL may be configured to have substantially the same technical features as the semiconductor device exemplarily described with reference to FIGS. 12 and 14. The vertical electrodes VE may be provided between the bit line plugs BLP. For example, the vertical electrodes VE and the bit line plugs BLP may be alternatingly arranged along a direction parallel to the bit line BL. Furthermore, each of the vertical electrodes VE may be connected in common to a pair of the selection transistors SST disposed adjacent thereto.

A plurality of memory elements ME may be connected in parallel to each of the vertical electrodes VE. Each of the memory elements ME may be connected to the corresponding one of the word lines WL. In other words, each of the word lines WL may be connected to the corresponding one of the vertical electrodes VE via the corresponding one of the memory elements ME.

Each of the selection transistors SST may include a selection line SL serving as a gate electrode thereof. In example embodiments, the selection lines SL may be parallel to the word lines WL.

Three-dimensional semiconductor memory devices according to example embodiments of the inventive concepts have been described with reference to FIGS. 21 through 26. These are merely provided as examples, to which the inventive concepts can be applied, but example embodiments of the inventive concepts may not be limited thereto.

Figure 27:
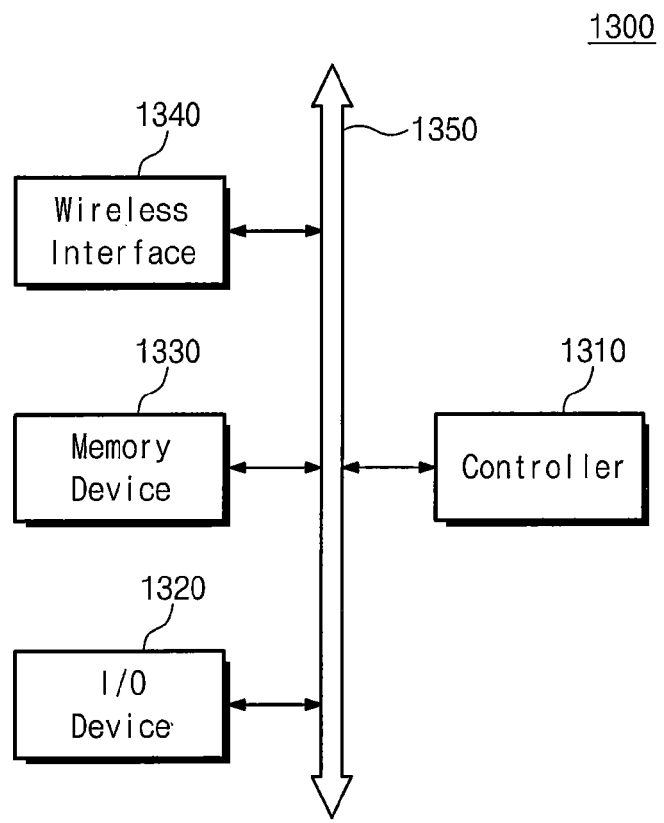
FIGS. 27 and 28 are schematic block diagrams illustrating electronic devices including a semiconductor device according to example embodiments of the inventive concepts.
Figure 28:
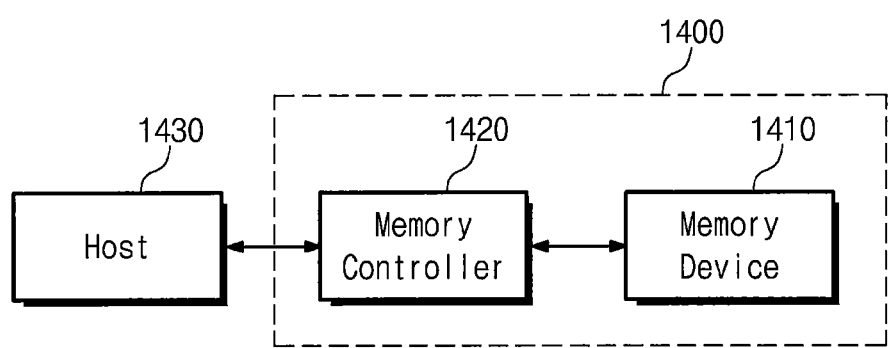

FIGS. 27 and 28 are schematic block diagrams illustrating electronic devices including a semiconductor device according to example embodiments of the inventive concepts.

Referring to FIG. 27, an electronic device 1300 including a semiconductor device according to example embodiments of inventive concepts may be used in a personal digital assistant (PDA), a laptop computer, a mobile computer, a web tablet, a wireless phone, a cell phone, a digital music player, a wire or wireless electronic device, and/or a complex electronic device including at least two of these devices. The electronic device 1300 may include a controller 1310, an input/output device 1320 such as a keypad, a keyboard, a display, a memory 1330, and a wireless interface 1340 that are combined to each other through a bus 1350. The controller 1310 may include, for example, a microprocessor, a digital signal processor and/or a microcontroller or the like. The memory 1330 may be configured to store a command code to be used by the controller 1310 or a user data. The memory 1330, the wireless interface 1340, the I/O device 1320 and/or the controller 1310 may include a semiconductor device according to example embodiments of the inventive concepts. The electronic device 1300 may use a wireless interface 1340 configured to transmit data to and/or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced and/or MMDS, and so forth.

Referring to FIG. 28, a memory system including a semiconductor device according to example embodiments of inventive concepts will be described. The memory system 1400 may include a memory device 1410 for storing huge amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410, the memory controller 1420 and/or the host 1430 may include a semiconductor device according to example embodiments of inventive concepts.

The semiconductor memory devices disclosed above may be encapsulated using various and diverse packaging techniques. For example, the semiconductor memory devices according to the aforementioned embodiments may be encapsulated using a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi-chip package (MCP) technique, a wafer-level fabricated package (WFP) technique and/or a wafer-level processed stack package (WSP) technique.

The package in which a semiconductor memory device according to example embodiments may be mounted may further include at least one semiconductor device (e.g., a controller and/or a logic device) that is configured to control the semiconductor memory device.

According to example embodiments of the inventive concepts, a staircase-shaped connection structure may be formed to have a buffer region. The presence of the buffer region makes it possible to improve uniformity in thickness of a mask pattern, which may be used for a single-layer etching step. Accordingly, the single-layer etching step can be performed with improved process reliability. In example embodiments, due to the improved uniformity in thickness of the mask pattern, the mask pattern can be formed by one exposure step, and this makes it possible to simplify a process of fabricating a semiconductor device.

While example embodiments of the inventive concepts have been particularly shown and described, it will be understood by one of ordinary skill in the art that variations in form and detail may be made therein without departing from the spirit and scope of the attached claims.

What is claimed is:

1. A three-dimensional semiconductor device, comprising:
    an electrode structure on a substrate, the electrode structure including an upper staircase region, a lower staircase region, and a buffer region therebetween,
    wherein the electrode structure comprises horizontal electrodes sequentially stacked on the substrate,
    the horizontal electrodes comprise a plurality of pad regions constituting a staircase structure of each of the upper and lower staircase regions, and
    the buffer region has a width that is larger than that of each of the pad regions.

2. The device of claim 1, wherein the buffer region has a thickness that is smaller than or equal to a minimum thickness of the upper staircase region and is greater than or equal to a maximum thickness of the lower staircase region.

3. The device of claim 1, further comprising an insulating layer on the electrode structure, wherein the insulating layer has a flat top surface and covers an entire top surface of the buffer region.

4. The device of claim 3, wherein the insulating layer has a substantially monotonically increasing thickness in a direction from the upper staircase region to the lower staircase region.

5. The device of claim 3, wherein the buffer region is in direct contact with the insulating layer.

6. The device of claim 1, wherein the electrode structure further comprises a cell array region,
    the upper staircase region is located between the cell array region and the lower staircase region, and
    the upper and lower staircase regions have a stepwise-decreasing thickness in a direction away from the cell array region.

7. The device of claim 6, wherein each of the upper and lower staircase regions has at least two different thicknesses, which are changed in an alternating manner, when measured at a same distance from the cell array region.

8. The device of claim 1, wherein, when viewed in a plan view, an uppermost one of the horizontal electrodes constituting the buffer region comprises:
   a connecting portion continuously extending from the upper staircase region to the lower staircase region; and
   a protruding portion horizontally protruding from the connecting portion, the protruding portion being spaced apart from at least one of the upper and lower staircase regions.

9. The device of claim 1, wherein, when viewed in a plan view, an uppermost one of the horizontal electrodes constituting the buffer region extends from the upper staircase region continuously to the lower staircase region and exposes a second uppermost one of the horizontal electrodes from the upper staircase region continuously to the lower staircase region.

10. The device of claim 1, further comprising charge-storing-type and/or variable-resistance-type memory cells that are three-dimensionally arranged on the substrate.

11. A semiconductor device, comprising:
   a staircase on a substrate, the staircase comprising a plurality of steps having conductive treads and an intermediate landing between a first one of the plurality of steps and a second one of the plurality of steps, the plurality of steps all going down in a given direction that extends along a face of the substrate.

12. The device of claim 11 wherein the intermediate landing is deeper than each of the conductive treads.

13. The device of claim 12 wherein the intermediate landing includes a conductive surface.

14. The device of claim 11 further comprising a plurality of conductive vias, a respective one of which electrically contacts a respective one of the conductive treads and extends away from the respective one of the conductive treads.

15. The device of claim 11 further comprising an insulating layer on the staircase, the insulating layer including a flat outer surface on the steps and a flat outer surface on the intermediate landing.

16. The device of claim 15 wherein the insulating layer increases in thickness going down the steps of the staircase.

17. The device of claim 11, wherein the substrate includes an upper staircase region, a lower staircase region, and a buffer region between the upper staircase region and the lower staircase region, and
   wherein a height of the staircase is greater in the upper staircase region than in the lower staircase region.

18. The device of claim 17, wherein the staircase has a decreasing thickness in a direction from the upper staircase region to the lower staircase region.

19. The device of claim 17, wherein the staircase has a substantially uniform thickness in the buffer region.

20. A semiconductor device, comprising:
   a staircase on a substrate, the staircase comprising a plurality of steps having conductive treads and an intermediate landing,
   wherein at least one of the conductive treads includes multiple levels.

* * * * *